(12) United States Patent
Tanaka

(10) Patent No.: US 11,257,749 B2
(45) Date of Patent: Feb. 22, 2022

(54) WIRING SUBSTRATE

(71) Applicant: SHINKO ELECTRIC INDUSTRIES CO., LTD., Nagano (JP)

(72) Inventor: Kazuhiro Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 112 days.

(21) Appl. No.: 16/691,789

(22) Filed: Nov. 22, 2019

(65) Prior Publication Data
US 2020/0168541 A1     May 28, 2020

(30) Foreign Application Priority Data
Nov. 27, 2018   (JP) .............................. JP2018-221293

(51) Int. Cl.
*H05K 1/11*        (2006.01)
*H01L 23/498*      (2006.01)
(Continued)

(52) U.S. Cl.
CPC ...... *H01L 23/49838* (2013.01); *H01L 21/486* (2013.01); *H01L 21/4857* (2013.01); *H01L 23/49822* (2013.01); *H01L 23/49827* (2013.01); *H01L 24/16* (2013.01); *H05K 1/0298* (2013.01); *H05K 1/115* (2013.01); *H01L 2224/16227* (2013.01)

(58) Field of Classification Search
CPC .............. H01L 23/49838; H01L 24/16; H01L 21/4857; H01L 23/49822; H01L 23/49827; H01L 21/486; H01L 2224/16227; H01L 2224/81192; H01L 2224/16237; H01L 23/49816; H05K 1/115; H05K 1/0298
See application file for complete search history.

(56) References Cited

U.S. PATENT DOCUMENTS

2011/0120762 A1* 5/2011 Kawai ................ H05K 3/423
                                                   174/264
2014/0021633 A1* 1/2014 Lee ................... H01L 23/481
                                                   257/774
(Continued)

FOREIGN PATENT DOCUMENTS

JP      6079150     1/2017
JP      6114527     3/2017

OTHER PUBLICATIONS

English Translation JP2006310779, Yoshida et al. (Year: 2006).*

*Primary Examiner* — Steven T Sawyer
(74) *Attorney, Agent, or Firm* — Rankin, Hill & Clark LLP

(57) ABSTRACT

A wiring substrate includes: a core layer having a first face, and a second face opposite to the first face; a through hole that penetrates the core layer; a first metal layer formed on an inner wall face of the through hole and formed on or above the first and second faces; a second metal layer that is formed on the first metal layer and fills the through hole, wherein the second metal layer has a first recess portion opposed to the through hole, and a second recess portion opposed to the first recess portion via the through hole; a third metal layer provided in the first recess portion; a fourth metal layer provided in the second recess portion; a fifth metal layer formed on the second metal layer and the third metal layer; and a sixth metal layer formed on the second metal layer and the fourth metal layer.

6 Claims, 14 Drawing Sheets

(51) Int. Cl.
H01L 23/00 (2006.01)
H01L 21/48 (2006.01)
H05K 1/02 (2006.01)

(56) References Cited

U.S. PATENT DOCUMENTS

| | | | |
|---|---|---|---|
| 2014/0084473 A1* | 3/2014 | Moon | H01L 21/30625 |
| | | | 257/751 |
| 2014/0097013 A1 | 4/2014 | Hara et al. | |
| 2015/0034378 A1* | 2/2015 | Kajihara | H05K 3/427 |
| | | | 174/266 |
| 2020/0035575 A1* | 1/2020 | Sunada | H05K 3/429 |

* cited by examiner

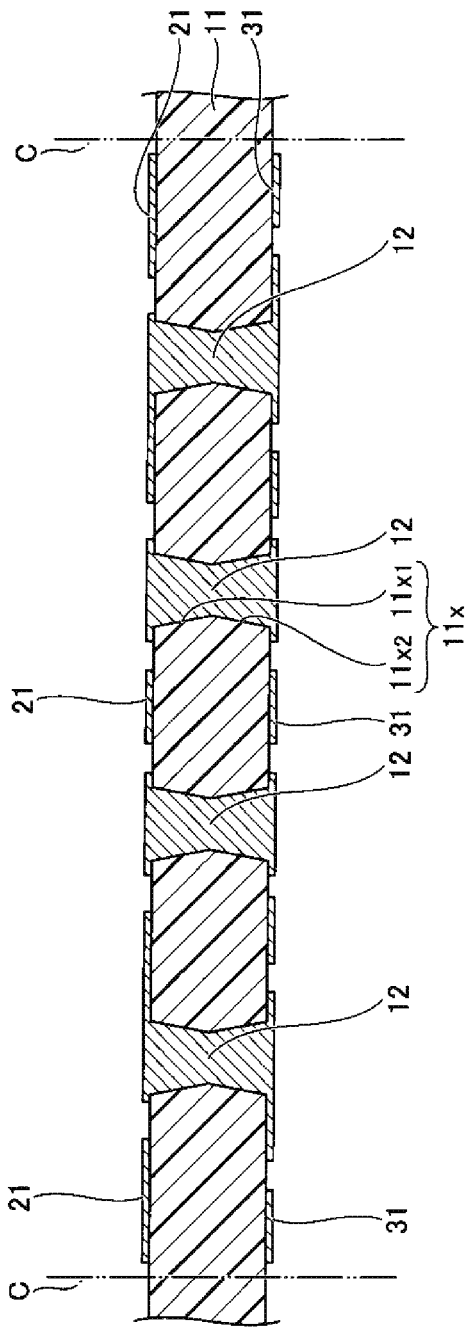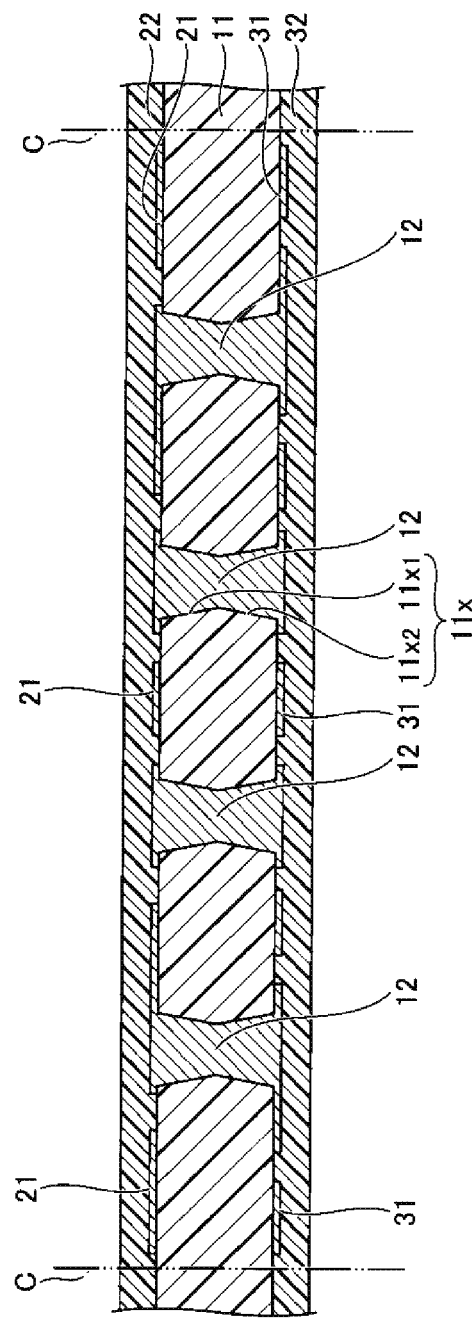

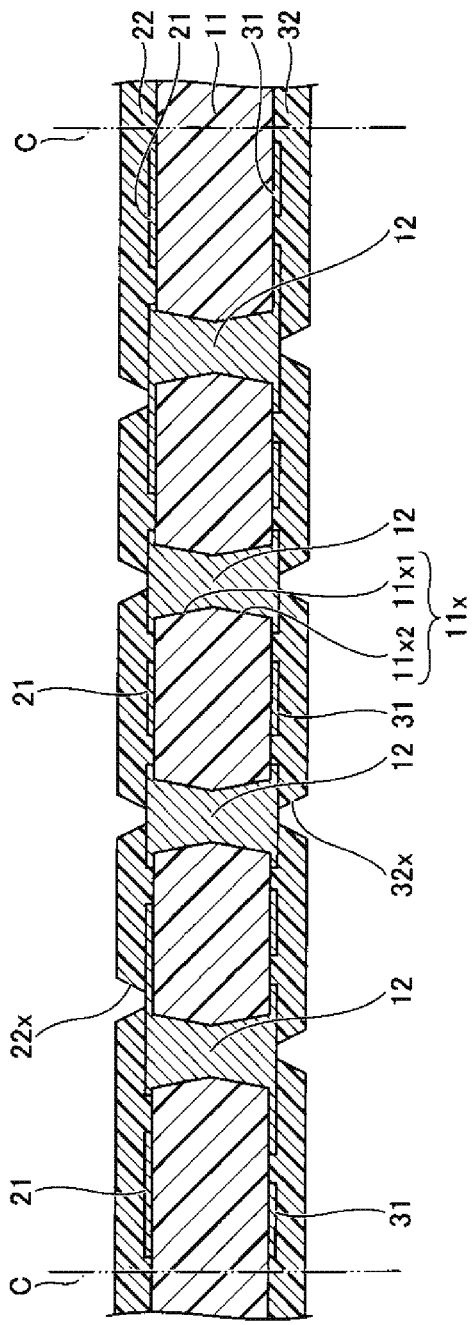
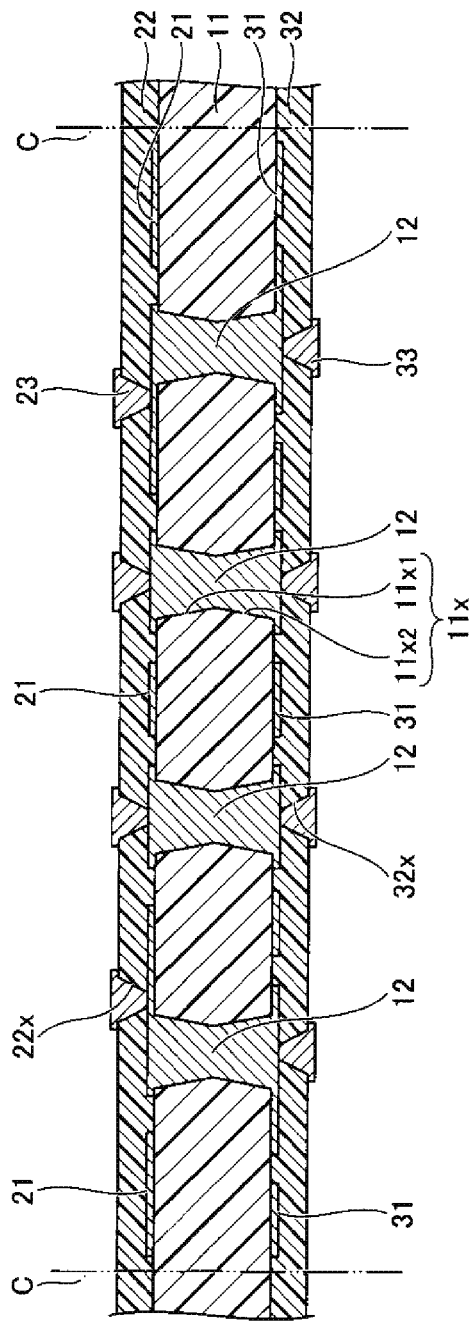
FIG.5A
FIG.5B

US 11,257,749 B2

WIRING SUBSTRATE

This application claims priority from Japanese Patent Applications No. 2018-221293, filed on Nov. 27, 2018, the entire contents of which are herein incorporated by reference.

BACKGROUND

1. Technical Field

The present disclosure relates to a wiring substrate.

2. Background Art

There has been known a wiring substrate in which through holes provided in a core layer are filled by plating so as to form through wirings. A method for forming a wiring layer by a semi-additive method has been proposed as a manufacturing method of such a wiring substrate (see e.g., Japanese Patent No. 6079150 and Japanese Patent No. 6114527).

However, according to the size or shape of each of the through holes, it is difficult to form the wiring layer with a suitable thickness on the core layer while filling the through holes suitably. For example, assume that an aspect ratio of the sectional shape of the through hole is large, or the size of the through hole is large. In this case, when the through hole is intended to be filled suitably, the wiring layer becomes excessively thick.

The present disclosure provides a wiring substrate in which wiring layers each having a suitable thickness can be obtained while through holes are filled suitably.

SUMMARY

Certain embodiments provide a wiring substrate.
The wiring substrate comprises:
a core layer comprising a first face, and a second face opposite to the first face;
a through hole that penetrates the core layer so as to extend from the first face to the second face;
a first metal layer that is formed on an inner wall face of the through hole and formed on or above the first and second faces;
a second metal layer that is formed on the first metal layer and fills the through hole, wherein the second metal layer comprises a first recess portion opposed to the through hole, and a second recess portion opposed to the first recess portion via the through hole;
a third metal layer that is provided in the first recess portion;
a fourth metal layer that is provided in the second recess portion;
a fifth metal layer that is formed on the second metal layer and the third metal layer; and
a sixth metal layer that is formed on the second metal layer and the fourth metal layer.

BRIEF DESCRIPTION OF DRAWINGS

FIGS. 4A and 4B are sectional views showing the manufacturing method of the wiring substrate according to the first embodiment (Part 2);
FIGS. 5A and 5B are sectional views showing the manufacturing method of the wiring substrate according to the first embodiment (Part 3)

DESCRIPTION OF EMBODIMENTS

Embodiments will be specifically described below with reference to the accompanying drawings. Incidentally, in the description of the present disclosure and the drawings, constituent elements having substantially identical functional configurations will be referred to by the same signs correspondingly and respectively. Therefore, duplicated description of such constituent elements may be omitted.

First Embodiment

Figure 1:
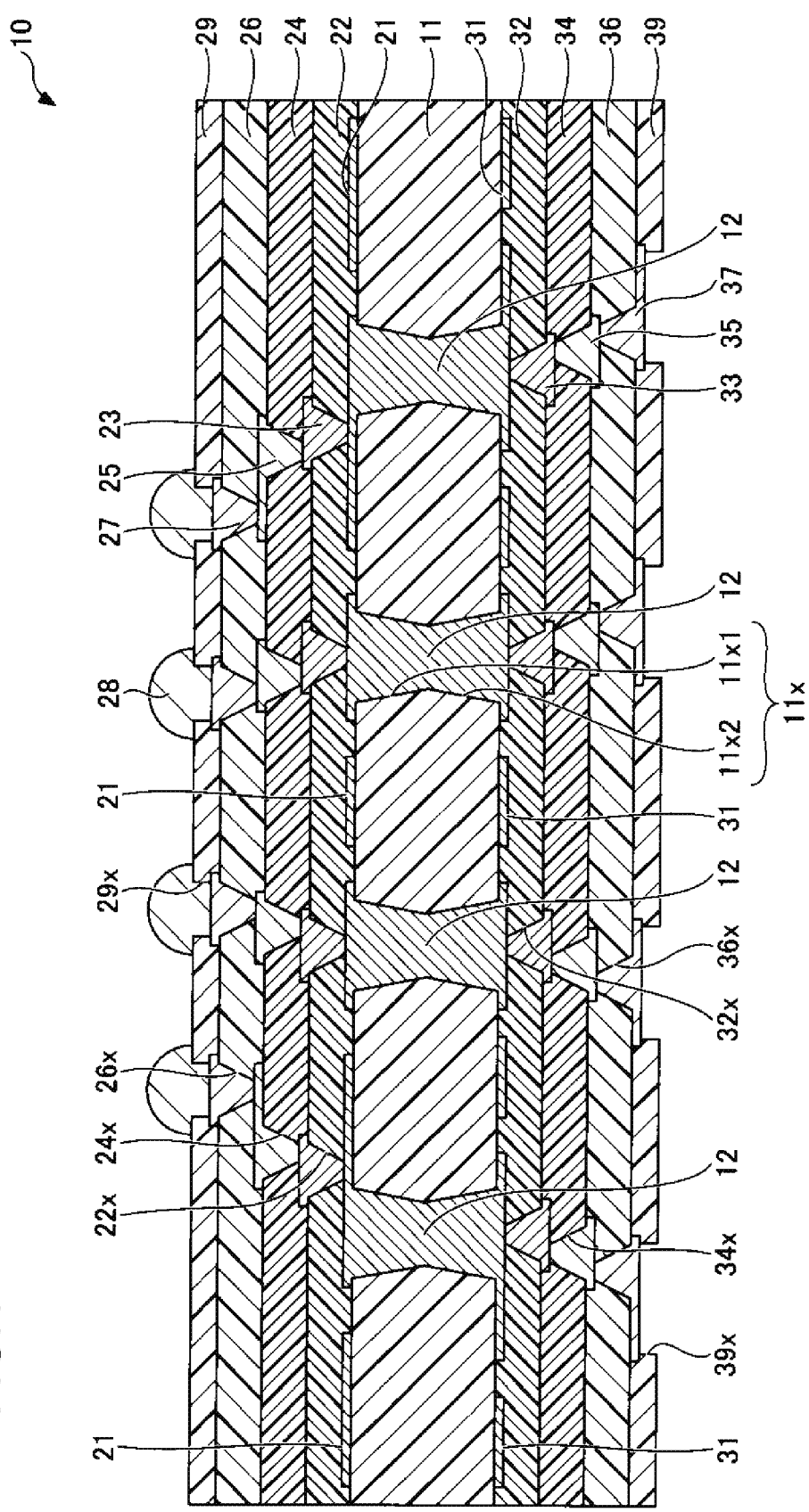
FIG. 1 is a sectional view showing a structure of a wiring substrate according to a first embodiment.
Figure 2:
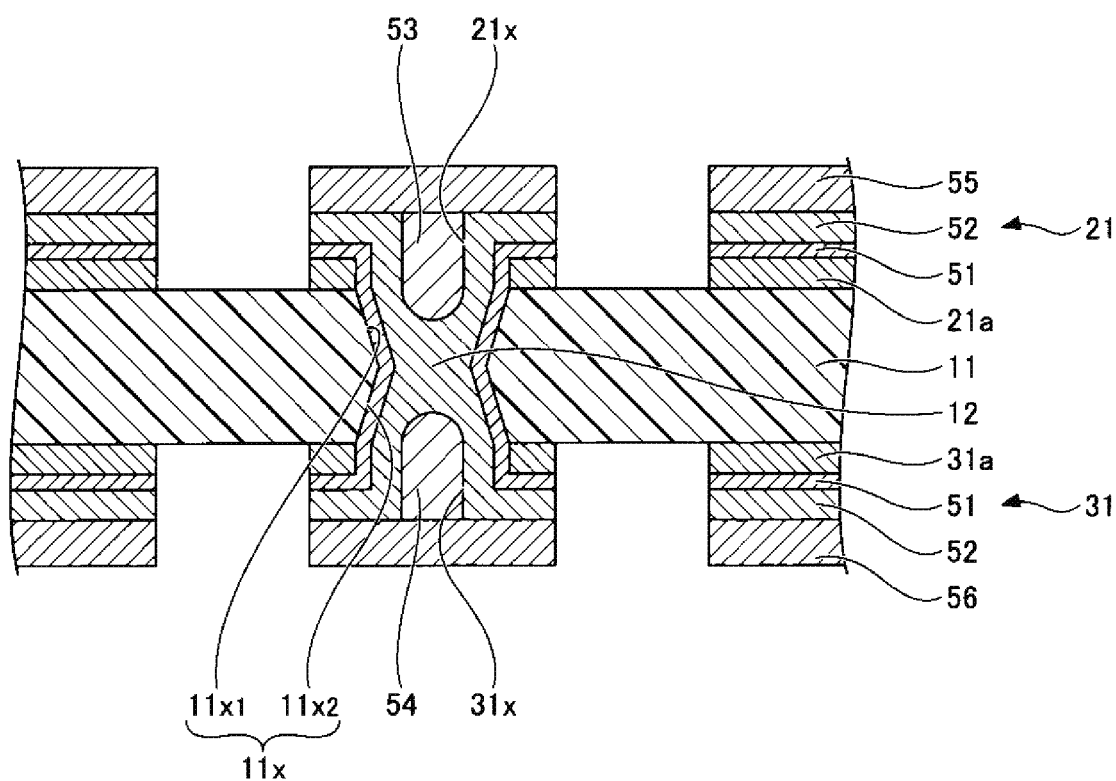
FIG. 2 is a sectional view showing a through hole of a core layer and its vicinity.

A first embodiment will be described. The first embodiment relates to a wiring substrate.
[Structure of Wiring Substrate]
First, the structure of the wiring substrate will be described. FIG. 1 is a sectional view showing the structure of the wiring substrate according to the first embodiment. FIG. 2 is a sectional view showing a through hole of a core layer and its vicinity.

As shown in FIG. 1, the wiring substrate 10 according to the first embodiment has the core layer 11, wiring layers 21 and 31, through wirings 12, an insulating layer 22, a wiring layer 23, an insulating layer 24, a wiring layer 25, an insulating layer 26, a wiring layer 27, external connection terminals 28, an insulating layer 32, a wiring layer 33, an insulating layer 34, a wiring layer 35, an insulating layer 36, a wiring layer 37, and solder resist layers 29 and 39.

Incidentally, for convenience, a side where the solder resist layer 29 is formed and a side where the solder resist layer 39 is formed may be referred to as one side (one face) and the other side (the other face) respectively in the wiring substrate 10.

In the wiring substrate 10, the wiring layer 21 is formed on one face of the core layer 11, and the wiring layer 31 is formed on the other face of the core layer 11. The wiring layer 21 and the wiring layer 31 are electrically connected to each other through the through wirings 12 formed in through holes 11x. Each of the through holes 11x penetrates the core layer 11 to extend from the one face of the core layer 11 to the other face of the core layer 11. Each of the wiring layers 21 and 31 is patterned into a predetermined planar shape. In the first embodiment, the wiring layer 21 is an example of a first wiring layer, and the wiring layer 31 is an example of a second wiring layer.

For example, a so-called glass epoxy substrate (core substrate), in which a piece of glass cloth is impregnated with an epoxy-based resin, etc. can be used as the core layer 11. A substrate, in which a piece of woven or non-woven cloth of glass fiber, carbon fiber, aramid fiber, or the like is impregnated with an insulating resin such as an epoxy-based resin or a polyimide-based resin, etc. may be used as the core layer 11. In addition, the core layer 11 may be configured as a multilayer wiring layer in which a plurality of wiring layers and a plurality of insulating layers are formed on one another. The core layer 11 can be, for example, made about 100 μm to 200 μm thick. The through holes 11x are provided in the core layer 11 to penetrate the core layer 11 in a thickness direction. Incidentally, illustration of the piece of glass cloth etc. will be omitted in the respective drawings.

Each of the through holes 11x has a first hole 11x formed to extend from the one face (an example of a first face) of the core layer 11, and a second hole $11x_2$ formed to extend from the other face (an example of a second face) of the core layer 11. The first hole $11x_1$ is a truncated conical hole in which an area of an opening portion on the one face side of the core layer 11 is larger than an area of a top portion formed in the core layer 11. In addition, the second hole $11x_2$ is a truncated conical hole in which an area of an opening portion on the other face side of the core layer 11 is larger than an area of a top portion formed in the core layer 11. The top portions of the first hole $11x_1$ and the second hole $11x_2$ communicate with each other inside the core layer 11 (e.g. in the vicinity of a thicknesswise central portion of the core layer 11) to thereby form the through hole 11x. Incidentally, a portion where the top portion of the first hole $11x_1$ and the top portion of the second hole $11x_2$ communicate with each other may be referred to as top portion communicating portion.

In other words, the through hole 11x has a drum shape. Here, the drum shape means a shape whose sectional area (sectional area in a plane direction) in the through hole 11x decreases continuously from each of the opening portion on the one face side of the core layer 11 and the opening portion on the other face side of the core layer 11 toward the top portion communicating portion. In the through hole 11x, the top portion communicating portion is a smallest sectional area portion (small diameter portion).

That is, the section (the section in the thickness direction) of the through hole 11x has a slope extending from the opening portion on the one face side of the core layer 11 toward the small diameter portion (the top portion communicating portion) of the approximately central portion of the through hole 11x. In addition, the section (the section in the thickness direction) of the through hole 11x has another slope extending from the opening portion on the other face side of the core layer 11 toward the small diameter portion (the top portion communicating portion) of the approximately central portion of the through hole 11x.

In the through hole 11x, each of the diameter of the opening portion on the one face side of the core layer 11 and the diameter of the opening portion on the other face side of the core layer 11 can be, for example, set in a range of about 80 μm to 100 μm. In addition, the diameter of the top portion communicating portion can be, for example, set in a range of about 60 μm to 70 μm.

However, each of the first hole $11x_1$ and the second hole $11x_2$ does not have to be the truncated conical hole. In this case, the sectional shape (the sectional shape in the plane direction) of each of the opening portion on the one face side of the core layer 11, the opening portion on the other face side of the core layer 11 and the top portion communicating portion may be, for example, an elliptical shape or another shape.

In addition, the top portion communicating portion is positioned in the vicinity of the thicknesswise central portion of the core layer 11. However, the top portion communicating portion may be shifted from the vicinity of the central portion toward the one side or the other side of the core layer 11. That is, there arises no problem even when the top portion communicating portion is shifted slightly in a vertical direction from the vicinity of the thicknesswise central portion of the core layer 11. In addition, there also arises no problem even when an axial portion of the first hole $11x_1$ and an axial portion of the second hole $11x_2$ are shifted from each other slightly in a horizontal direction.

In addition, in the through hole 11x, the sectional shape (the sectional shape in the thickness direction) of an inner wall face of a portion extending from the opening portion on the one side to the top portion communicating portion and the sectional shape (the sectional shape in the thickness direction) of an inner wall face of a portion extending from the opening portion on the other side to the top portion communicating portion may be linear or may be curved.

As shown in FIG. 2, the wiring layer 21 has a structure in which a first metal foil 21a, a first metal layer 51, a second metal layer 52 and a fifth metal layer 55 are sequentially formed on the one face of the core layer 11. The wiring layer 31 has a structure in which a second metal foil 31a, the first metal layer 51, the second metal layer 52 and a sixth metal layer 56 are sequentially formed on the other face of the core layer 11.

In the inside of the through hole 11x and a peripheral portion thereof, the first metal layer 51 and the second metal layer 52 are formed continuously from the one face of the core layer 11 toward the other face of the core layer 11 through the through hole 11x. More specifically, in the inside of the through hole 11x and the peripheral portion thereof, the first metal layer 51 covers the inner wall face of the through hole 11x, and extends to the one face and the other face of the core layer 11. The first metal layer 51 covers the first metal foil 21a on the one face of the core layer 11, and covers the second metal foil 31a on the other face of the core layer 11.

In addition, in the inside of the through hole 11x, the second metal layer 52 is formed not to entirely fill the through hole 11x but to cover the first metal layer 51 covering the inner wall face of the through hole 11x and to fill a depthwise central portion of the through hole 11x. A first recess portion 21x is formed in the through hole 11x and above the through hole 11x. The first recess portion 21x is opened on the one face side of the core layer 11 while the second metal layer 52 filling the central portion of the through hole 11x is used as a bottom portion of the first recess portion 21x. In addition, a second recess portion 31x is formed in the through hole 11x and above the through hole 11x. The second recess portion 31x is opened on the other face side of the core layer 11 while the second metal layer 52 filling the central portion of the through hole 11x is used as a bottom portion of the second recess portion 31x.

In other words, the sectional shape of the second metal layer 52 inside the through hole 11x is formed as an X-shape. Incidentally, the X-shape means a shape approximated by the letter X. For example, a hatched portion constituting the X may be a linear portion or a curved portion or may include the both.

The first recess portion 21x and the second recess portion 31x are formed in the second metal layer 52 so as to be opposed to the through hole 11x. The first recess portion 21x is opposed to the second recess portion 31x. Particularly, the first recess portion 21x and the second recess portion 31x are separated from each other. The depthwise central portion of the through hole 11x is positioned between the first recess portion 21x and the second recess portion 31x. In addition, the first recess portion 21x and the second recess portion 31x partially overlap the through hole 11x in the thickness direction of the core layer 11.

A third metal layer 53 fills the first recess portion 21x. An upper face of the third metal layer 53 is substantially flat, preferably flush with an upper face of the second metal layer 52. In addition, a fourth metal layer 54 fills the second recess portion 31x. A lower face of the fourth metal layer 54 is substantially flat, preferably flush with a lower face of the second metal layer 52.

Incidentally, the third metal layer 53 may not fill the whole of the first recess portion 21x. However, it is preferable that the third metal layer 53 fills the first recess portion 21x to such an extent that the hollow of the first recess portion 21x is not reflected in an upper face of the fifth metal layer 55. For example, it is preferable that the third metal layer 53 fills about 80% or more of the first recess portion 21x in the thickness direction. In a similar manner or the same manner, the fourth metal layer 54 may not fill the whole of the second recess portion 31x. However, it is preferable that the fourth metal layer 54 fills the second recess portion 31x to such an extent that the hollow of the second recess portion 31x is not reflected in a lower face of the sixth metal layer 56. For example, it is preferable that the fourth metal layer 54 fills about 80% or more of the second recess portion 31x in the thickness direction. In addition, the upper face of the third metal layer 53 may be upper than the upper face of the second metal layer 52. The lower face of the fourth metal layer 54 may be lower than the lower face of the second metal layer 52.

The fifth metal layer 55 covers the second metal layer 52 and the third metal layer 53 on the one face side of the core layer 11. The upper face of the fifth metal layer 55 is substantially flat. The upper faces of the second metal layer 52 and the third metal layer 53 adjoin a face of the fifth metal layer 55 on the core layer 11 side. In addition, the sixth metal layer 56 covers the second metal layer 52 and the fourth metal layer 54 on the other face side of the core layer 11. The lower face of the sixth metal layer 56 is substantially flat. The lower faces of the second metal layer 52 and the fourth metal layer 54 adjoin a face of the sixth metal layer 56 on the core layer 11 side.

Figure 14:
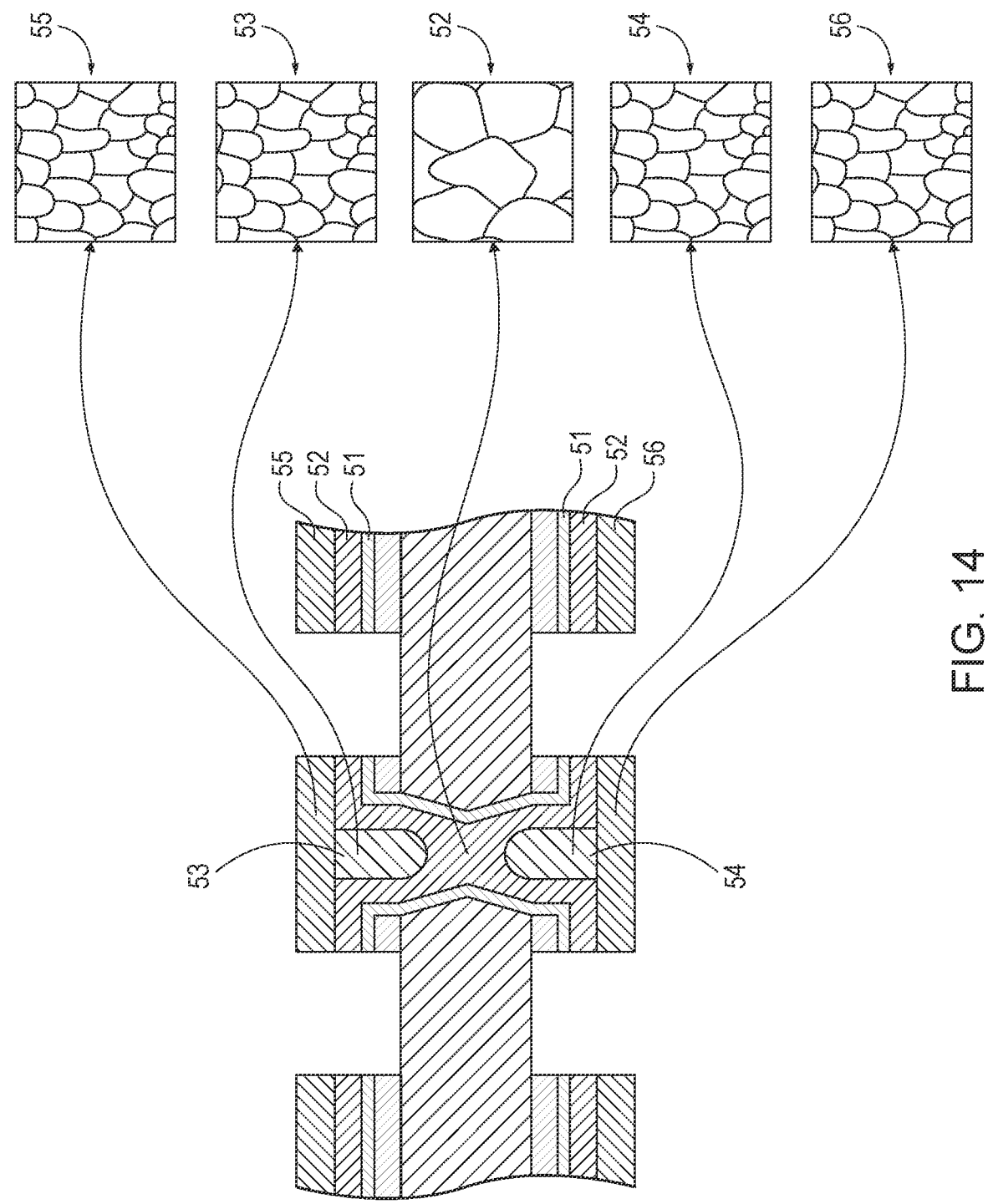
FIG. 14 is a sectional view showing the through hole of the core layer and its vicinity, and illustrating an average crystal grain size of metal layers.

For example, an average crystal grain size of the third metal layer 53 and an average crystal grain size of the fourth metal layer 54 are smaller than an average crystal grain size of the second metal layer 52, as shown in FIG. 14. Since the average crystal grain size of the third metal layer 53 and the average crystal grain size of the fourth metal layer 54 are smaller than the average crystal grain size of the second metal layer 52, the first recess portion 21x and the second recess portion 31x are easily filled with the third metal layer 53 and the fourth metal layer 54 suitably. An average crystal grain size of the fifth metal layer 55 and an average crystal grain size of the sixth metal layer 56 can be, for example, made similar to or the same as the average crystal grain size of the third metal layer 53 and the average crystal grain size of the fourth metal layer 54, as also shown in FIG. 14.

A portion which is constituted by the first metal layer 51, the second metal layer 52, the third metal layer 53 and the fourth metal layer 54 and which is formed inside the through hole 11x serves as a through wiring 12. For example, copper (Cu) etc. can be used as the material of each of the first metal foil 21a, the second metal foil 31a, the first metal layer 51, the second metal layer 52, the third metal layer 53, the fourth metal layer 54, the fifth metal layer 55 and the sixth metal layer 56.

Each of the first metal foil 21a and the second metal foil 31a can be, for example, made about 3 μm to 5 μm thick. The first metal layer 51 can be, for example, made about 0.5 μm to 1.0 μm thick. The second metal layer 52 above each of the one face and the other face of the core layer 11 can be, for example, made about 5 μm to 7 μm thick. The second metal layer 52 has, for example, a thickness which is about 60% to 70% of the thickness of the core layer 11 at the center of the through hole 11x. Each of the third metal layer 53 and the fourth metal layer 54 at the center of the through hole 11x can be, for example, made about 30 μm to 50 μm thick. Each of the fifth metal layer 55 and the sixth metal layer 56 can be, for example, made about 10 μm to 15 μm thick. For example, the fifth metal layer 55 is thicker than the second metal layer 52 above the one face of the core layer 11, and the sixth metal layer 56 is thicker than the second metal layer 52 above the other face of the core layer 11. The fifth metal layer 55 may be thinner than the second metal layer 52 above the one face of the core layer 11, and the sixth metal layer 56 may be thinner than the second metal layer 52 above the other face of the core layer 11.

As shown in FIG. 1, the insulating layer 22 is formed on the one face of the core layer 11 so as to cover the wiring layer 21. For example, an insulating resin containing an epoxy-based resin or a polyimide-based resin as a main component, etc., can be used as the material of the insulating layer 22. The insulating layer 22 may contain a filler made of silica ($SiO_2$) etc. The insulating layer 22 can be, for example, made about 30 μm to 70 μm thick.

The wiring layer 23 is formed on one side of the insulating layer 22. The wiring layer 23 is configured to include via wirings with which via holes 22x are filled, and wiring patterns which are formed on the one face of the insulating layer 22. The via holes 22x penetrate the insulating layer 22 to expose one face of the wiring layer 21. Each of the via holes 22x is a truncated conical recess portion which is opened on the insulating layer 24 side and has a bottom face formed by the one face of the wiring layer 21, and in which an area of the opening portion is larger than an area of the bottom face. For example, copper (Cu) etc. can be used as the material of the wiring layer 23. The wiring layer 23 can be, for example, made about 10 μm to 30 μm thick.

The insulating layer 24 is formed on the one face of the insulating layer 22 so as to cover the wiring layer 23. The material or thickness of the insulating layer 24 can be, for example, made similar to or the same as that of the insulating layer 22. The insulating layer 24 may contain a filler made of silica ($SiO_2$) etc.

The wiring layer 25 is formed on one side of the insulating layer 24. The wiring layer 25 is configured to include via wirings with which via holes 24x are filled, and wiring patterns which are formed on the one face of the insulating layer 24. The via holes 24x penetrate the insulating layer 24 to expose one face of the wiring layer 23. Each of the via holes 24x is a truncated conical recess portion which is opened on one the insulating layer 26 side and has a bottom face formed by the one face of the wiring layer 23, and in which an area of the opening portion is larger than an area of the bottom face. The material or thickness of the wiring layer 25 can be, for example, made similar to or the same as that of the wiring layer 23.

The insulating layer 26 is formed on the one face of the insulating layer 24 so as to cover the wiring layer 25. The material or thickness of the insulating layer 26 can be, for example, made similar to or the same as that of the insulating layer 22. The insulating layer 26 may contain a filler made of silica ($SiO_2$) etc.

The wiring layer 27 is formed on one side of the insulating layer 26. The wiring layer 27 is configured to include via wirings with which via holes 26x are filled, and wiring patterns which are formed on the one face of the insulating layer 26. The via holes 26x penetrate the insulating layer 26 to expose one face of the wiring layer 25. Each of the via holes 26x is a truncated conical recess portion which is opened on the solder resist layer 29 side and has a bottom face formed by the one face of the wiring layer 25, and in which an area of the opening portion is larger than an area of the bottom face. The material or thickness of the wiring layer 27 can be, for example, made similar to or the same as that of the wiring layer 23.

The solder resist layer 29 is formed on the one face of the insulating layer 26 so as to cover the wiring layer 27. The solder resist layer 29 can be formed, for example, from a photosensitive resin such as an epoxy-based resin or an acrylic-based resin, etc. The solder resist layer 29 can be, for example, made about 30 μm to 70 μm thick.

The solder resist layer 29 has opening portions 29x. Portions of the wiring layer 27 are exposed inside the opening portions 29x. The portions of the wiring layer 27 exposed inside the opening portions 29x function as pads electrically connected to a semiconductor chip etc. (not shown). Therefore, the portions of the wiring layer 27 exposed inside the opening portions 29x may be referred to as first pads 27.

A metal layer may be formed on each of one faces of the first pads 27, or antioxidation treatment such as OSP (Organic Solderability Preservative) treatment may be applied to the one faces of the first pads 27. Examples of the metal layer may include an Au layer, an Ni/Au layer (a metal layer in which an Ni layer and an Au layer are deposited in the named order), an Ni/Pd/Au layer (a metal layer in which an Ni layer, a Pd layer and an Au layer are deposited in the named order), etc. The metal layer can be, for example, made about 0.03 μm to 10 μm thick.

The external connection terminals 28 are provided on the one faces of the first pads 27. For example, solder balls etc. can be used as the external connection terminals 28. For example, an alloy containing Pd, an Sn—Cu alloy, an Sn—Sb alloy, an Sn—Ag alloy, an Sn—Ag—Cu alloy, etc. can be used as the material of the solder balls.

However, the solder resist layer 29 may be provided to entirely expose the wiring layer 27. In this case, the solder resist layer 29 may be provided so that a side face of the wiring layer 27 and a side face of the solder resist layer 29 adjoin each other, or the solder resist layer 29 may be provided so that a gap can be formed between the side face of the solder layer 27 and the side face of the solder resist layer 29.

Incidentally, the wiring patterns constituting the wiring layer 27 may be formed to be led out onto the one face of the insulating layer 26, and the opening portions 29x may be formed on the wiring patterns led out onto the one face of the insulating layer 26. That is, the opening portions 29x may be disposed on, of the wiring layer 27, portions which are not above the via holes 26x. In addition, the external connection terminals 28 do not have to be provided.

The insulating layer 32 is formed on the other face of the core layer 11 so as to cover the wiring layer 31. The material or thickness of the insulating layer 32 can be, for example, made similar to or the same as that of the insulating layer 22. The insulating layer 32 may contain a filler made of silica ($SiO_2$) etc.

The wiring layer 33 is formed on the other side of the insulating layer 32. The wiring layer 33 is configured to include via wirings with which via holes 32x are filled, and wiring patterns which are formed on the other face of the insulating layer 32. The via holes 32x penetrate the insulating layer 32 to expose the other face of the wiring layer 31. Each of the via holes 32x is a truncated conical recess portion which is opened on the insulating layer 34 side and has a bottom face formed by the other face of the wiring layer 31, and in which an area of the opening portion is larger than an area of the bottom face. The material or thickness of the wiring layer 33 can be, for example, made similar to or the same as the wiring layer 23.

The insulating layer 34 is formed on the other face of the insulating layer 32 so as to cover the wiring layer 33. The material or thickness of the insulating layer 34 can be, for example, made similar to or the same as that of the insulating layer 22. The insulating layer 34 may contain a filler made of silica ($SiO_2$) etc.

The wiring layer 35 is formed on the other side of the insulating layer 34. The wiring layer 35 is configured to include via wirings with which via holes 34x are filled, and wiring patterns which are formed on the other face of the insulating layer 34. The via holes 34x penetrate the insulating layer 34 to expose the other face of the wiring layer 33. Each of the via holes 34x is a truncated conical recess portion which is opened on the insulating layer 36 side and has a bottom face formed by the other face of the wiring layer 33, and in which an area of the opening portion is larger than an area of the bottom face. The material or thickness of the wiring layer 35 can be, for example, made similar to or the same as that of the wiring layer 23.

The insulating layer 36 is formed on the other face of the insulating layer 34 so as to cover the wiring layer 35. The material or thickness of the insulating layer 36 can be, for example, made similar to or the same as that of the insulating layer 22. The insulating layer 36 may contain a filler made of silica ($SiO_2$) etc.

The wiring layer 37 is formed on the other side of the insulating layer 36. The wiring layer 37 is configured to include via wirings with which via holes 36x are filled, and wiring patterns which are formed on the other face of the insulating layer 36. The via holes 36x penetrate the insulating layer 36 to expose the other face of the wiring layer 35. Each of the via holes 36x is a truncated conical recess portion which is opened on the solder resist layer 39 side and has a bottom face formed by the other face of the wiring layer 35, and in which an area of the opening portion is larger than an area of the bottom face. The material or thickness of the wiring layer 37 can be, for example, made similar to or the same as that of the wiring layer 23.

The solder resist layer 39 is formed on the other face of the insulating layer 36 so as to cover the wiring layer 37. The material or thickness of the solder resist layer 39 can be, for example, made similar to or the same as the solder resist layer 29.

The solder resist layer 39 has opening portions 39x. Portions of the wiring layer 37 are exposed inside the opening portions 39x. The portions of the wiring layer 37 exposed inside the opening portions 39x function as pads electrically connected to a mount board (not shown) such as a motherboard, etc. Therefore, the portions of the wiring layer 37 exposed inside the opening portions 39x may be referred to as second pads 37. Incidentally, the planar shape of each of the second pads 37 is larger than the planar shape of each of the first pads 27, and a pitch of the second pads 37 is wider than a patch of the first pads 27.

A metal layer may be formed on each of the other faces of the second pads 37, or antioxidation treatment such as OSP (Organic Solderability Preservative) treatment may be applied to the other faces of the second pads 37. Examples of the metal layer may include an Au layer, an Ni/Au layer (a metal layer in which an Ni layer and an Au layer are formed in this order), an Ni/Pd/Au layer (a metal layer in which an Ni layer, a Pd layer and an Au layer are formed in this order), etc. The metal layer can be, for example, made about 0.03 μm to 10 μm thick. In addition, external connection terminals such as solder balls or lead pins may be formed on the other faces of the second pads 37.

Incidentally, the wiring patterns constituting the wiring layer 37 may be formed to be led out onto the insulating layer 36, and the opening portions 39x may be formed on the wiring patterns led out onto the insulating layer 36. That is, the opening portions 39x may be disposed on, of the wiring layer 37, portions which are not above the via holes 36x.

According to the first embodiment, the average crystal grain size of the third metal layer 53 and the average crystal grain size of the fourth metal layer 54 are smaller than the average crystal grain size of the second metal layer 52, as shown in FIG. 14. Accordingly, the third recess portion 21x and the second recess portion 31x can be filled with the third metal layer 53 and the fourth metal layer 54 suitably. In addition, the fifth metal layer 55 is formed independently of the third metal layer 53. Accordingly, the thickness of the fifth metal layer 55 is not affected by the thickness of the third metal layer 53. In a similar manner or the same manner, the sixth metal layer 56 is formed independently of the fourth metal layer 54. Accordingly, the thickness of the sixth metal layer 56 is not affected by the thickness of the fourth metal layer 54. Accordingly, the respective thicknesses of the wiring layers 21 and 31 can be controlled independently of filling properties of the first recess portions 21x and the second recess portions 31x. Therefore, the through holes 11x can be filled suitably so that the wiring layers 21 and 31 can be obtained with suitable thicknesses.

[Manufacturing Method of Wiring Substrate]

Next, a manufacturing method of the wiring substrate 10 according to the first embodiment will be described. FIGS. 3A to 7B are sectional views showing the manufacturing method of the wiring substrate 10 according to the first embodiment.

Figure 3A:
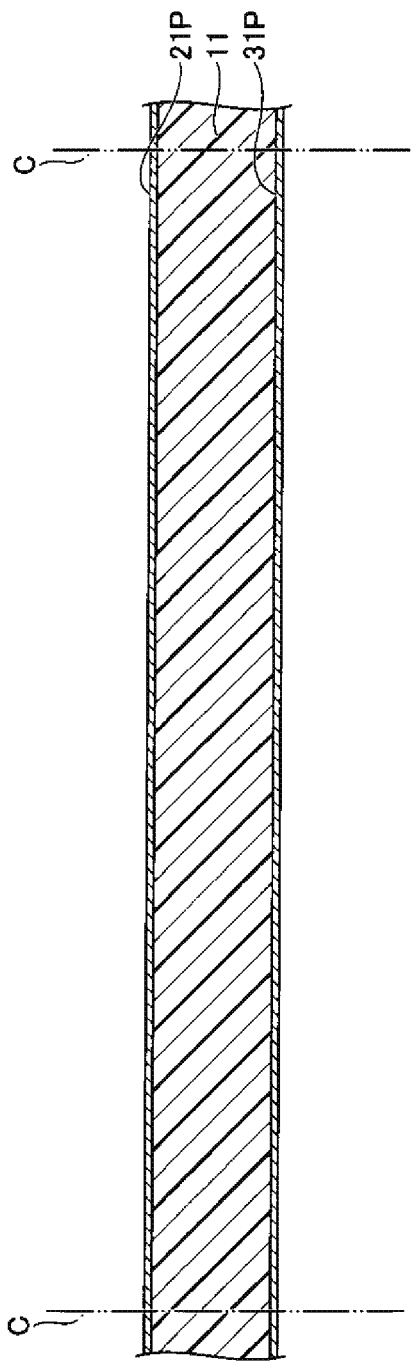
FIGS. 3A and 3B are sectional views showing a manufacturing method of the wiring substrate according to the first embodiment (Part 1)

First, a layered plate in which a first metal foil 21P (a solid metal foil which has not been patterned yet) is formed on one face of a core layer 11, and a second metal foil 31P (a solid metal foil which has not been patterned yet) is formed on the other face of the core layer 11 is prepared, as shown in FIG. 3A.

For example, a so-called glass epoxy substrate, in which a piece of glass cloth is impregnated with an epoxy-based resin, etc. can be used as the core layer 11. A substrate, in which a piece of woven or non-woven cloth of glass fiber, carbon fiber, aramid fiber, or the like is impregnated with an insulating resin such as an epoxy-based resin or a polyimide-based resin, etc. may be used as the core layer 11. The core layer 11 can be, for example, made about 100 μm to 200 μm thick.

For example, a copper foil etc. can be used as each of the first metal foil 21P and the second metal foil 31P. Each of the first metal foil 21P and the second metal foil 31P can be, for example, made about 12 μm to 18 μm thick. However, it is preferable that the first metal foil 21P and the second metal foil 31P are thinned to a thickness of about 3 μm to 5 μm by etching etc. in advance. When each of the first metal foil 21P and the second metal foil 31P is a copper foil, the first metal foil 21P or the second metal foil 31P can be etched and thinned, for example, by use of a sulfuric acid hydrogen peroxide-based etching solution, a chlorine persulfate-based etching solution, or the like.

Incidentally, the first metal foil 21P and the second metal foil 31P are thinned in order to facilitate laser machining in a subsequent step or to reduce burrs which will occur at ends of machined portions of the first metal foil 21P and the second metal foil 31P during the laser machining. In addition, the first metal foil 21P and the second metal foil 31P are thinned also in order to attain fine pitches of wiring layers 21 and 31. In the subsequent step, the first metal foil 21P and the second metal foil 31P are patterned into portions which will serve as a first metal foil 21a and a second metal foil 31a respectively.

Figure 3B:
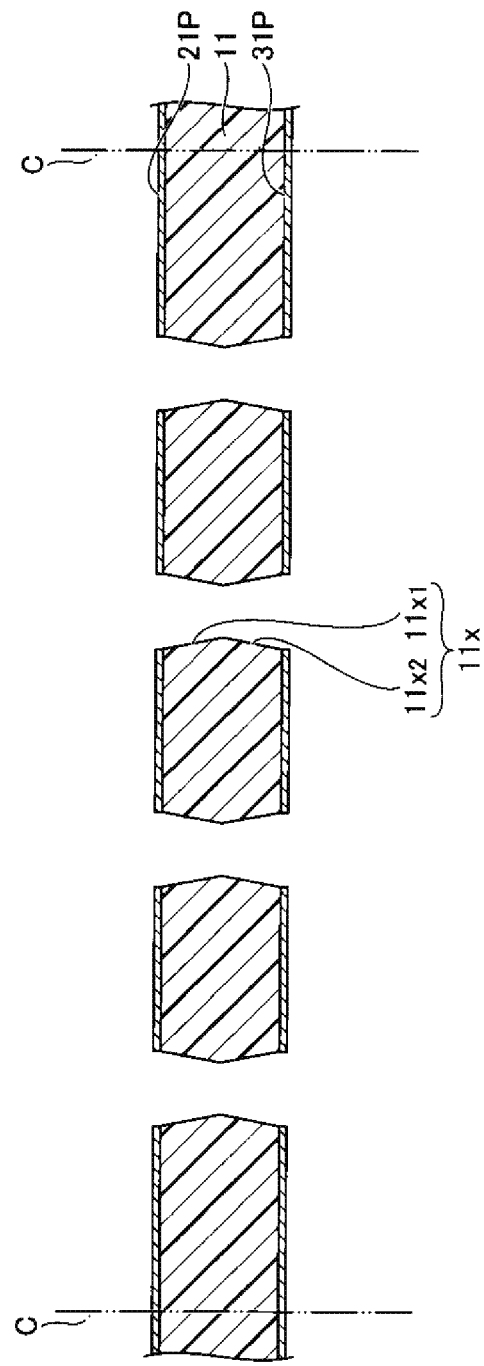

Next, as shown in FIG. 3B, through holes 11x are formed, for example, by a laser machining method using a $CO_2$ laser etc. to penetrate the core layer 11, the first metal foil 21P and the second metal foil 31P. In forming the through holes 11x, first, laser light is radiated onto the one face side of the core layer 11 through the first metal foil 21P to thereby form first holes $11x_1$ on the one face side of the core layer 11.

Next, laser light is radiated onto, of the other face of the core layer 11, positions corresponding to the first holes $11x_1$ through the second metal foil 31P to thereby form second holes $11x_2$ on the other face side of the core layer 11. Thus, top portions of the first holes $11x_1$ and the second holes $11x_2$ communicate with each other respectively in the vicinities of thicknesswise central portions of the core layer 11 to thereby form the through holes 11x. In the formation of the first holes $11x_1$, it does not matter whether the first holes $11x_1$ penetrates the core layer 11 or not as long as the through holes 11 can be formed in the end.

Each of the first holes $11x_1$ is a truncated conical hole in which an area of an opening portion on the one face side of the core layer 11 is larger than an area of the top portion formed inside the core layer 11. In addition, each of the second holes $11x_2$ is a truncated conical hole in which an area of an opening portion on the other face side of the core layer 11 is larger than an area of the top portion formed inside the core layer 11. In other words, the through hole 11x is shaped like a drum.

Incidentally, each of the first hole $11x_1$ and the second hole $11x_2$ may not be formed into the truncated conical hole. In this case, each of sectional shapes (sectional shapes in a plane direction) of the opening portion on the one face side of the through hole 11x, the opening portion on the other face side of the through hole 11x, and the top portion communicating portion can be, for example, an elliptical shape or another shape. In addition, the top portion communicating portion is positioned in the vicinity of the thicknesswise central portion of the core layer 11. However, the top portion communicating portion may be shifted toward the one side or the other side of the core layer 11 from the vicinity of the central portion.

In addition, in the through hole 11x, a sectional shape (a sectional shape in the thickness direction) of an inner wall face of a portion extending from the opening portion on the one side to the top portion communicating portion, and a sectional shape (a sectional shape in the thickness direction) of an inner wall face of a portion extending from the opening portion on the other side to the top portion communicating portion may be linear or may be curved.

When the through holes 11x are formed by the laser machining method, burrs in which end portions of the first metal foil 21P overhang in eave shapes inside the through holes 11x may occur at opening ends of the through holes 11x on the one side. In a similar manner or the same manner, burrs in which end portions of the second metal foil 31P overhang in eave shapes inside the through holes 11x may occur at opening ends of the through holes 11x on the other side. Incidentally, end portions of the burrs may be turned up or the material of the first metal foil 21P or the second metal foil 31P melted by the laser may be stuck to the end portions of the burrs.

In such a case, it is preferable that the burrs are removed, for example, by etching using a sulfuric acid hydrogen peroxide-based etching solution, a chlorine persulfate-based etching solution, or the like. In addition, the burrs may be removed by buff polishing, blast treatment, high pressure spray cleaning, or the like, in place of the etching. Incidentally, it is preferable that the first metal foil 21P and the second metal foil 31P are thinned in advance to make it possible to remove the burrs easily.

During the removal of the burrs, the first metal foil 21P at circumferential edges of the opening portions of the through holes 11x in the one face of the core layer 11 may be removed annularly together with the burrs to expose the one face of the core layer 11 annularly. However, this does not cause any problem in particular. In a similar manner or the same manner, the second metal foil 31P at circumferential edges of the opening portions of the through holes 11x in the other face of the core layer 11 may be removed annularly together with the burrs to expose the other face of the core layer 11 annularly. However, this does not cause any problem in particular.

Incidentally, it is preferable that surface treatment is applied to each of one face of the first metal foil 21P and the other face of the second metal foil 31P in advance between the step shown in FIG. 3A and the step shown in FIG. 3B, in order to facilitate application of the laser machining. An example of the surface treatment may include, for example, black oxide treatment. The black oxide treatment means oxidation treatment to be performed on the surface of the metal foil using sodium chlorite etc. The black oxide treatment is one kind of roughening treatment.

By the black oxide treatment, an oxide film including fine irregularities about 1 μm high is formed on each of the one face of the first metal foil 21P and the other face of the second metal foil 31P. That is, a roughened face caused by the oxide film is formed on each of the one face of the first metal foil 21P and the other face of the second metal foil 31P. The oxide film (the roughened face) is visually recognized as a blackish color or a brownish color.

The blackish or brownish oxide film easily absorbs wavelengths of laser light radiating in a subsequent step. Accordingly, the blackish or brownish oxide film can enhance machinability of the laser machining. For example, a wavelength band of a $CO_2$ laser is infrared. However, the blackish or brownish oxide film broadly absorbs light with a wavelength band including ultraviolet light, visible light, infrared light, etc. Accordingly, the blackish or brownish oxide film can enhance the machinability of the laser machining.

Incidentally, when the burrs are removed by etching as described above, the blackish or brownish oxide film can be also removed together with the burrs. However, any other treatment than the black oxide treatment may be applied as long as the wavelengths of the laser light radiating in the subsequent step can be absorbed easily.

Next, desmear treatment is applied to the inside of the through holes 11x or to the surface of the first metal foil 21P and the surface of the second metal foil 31P if occasions demand. Then, the wiring layers 21 and 31 and through wirings 12 are formed, as shown in FIG. 4A. A method for forming the wiring layers 21 and 31 and the through wirings 12 will be described later.

After the wiring layers 21 and 31 and the through wirings 12 are formed, an insulating resin film such as a film-like epoxy-based resin is laminated on the one face of the core layer 11 to cover the wiring layer 21 to thereby form an insulating layer 22, as shown in FIG. 4B. In addition, an insulating resin film such as a film-like epoxy-based resin etc. is laminated on the other face of the core layer 11 to cover the wiring layer 31 to thereby form an insulating layer 32. Alternatively, the insulating layers 22 and 32 may be formed by applying a liquid or paste-like insulating resin such as an epoxy-based resin in place of the lamination of the film-like epoxy-based resin etc., and then curing the liquid or paste-like insulating resin. Each of the insulating layers 22 and 32 can be, for example, made about 30 μm to 70 μm thick. Each of the insulating layers 22 and 32 may include a filler made of silica ($SiO_2$) etc.

Next, as shown in FIG. 5A, via holes 22x are formed in the insulating layer 22 to penetrate the insulating layer 22 to expose one face of the wiring layer 21. In addition, via holes 32x are formed in the insulating layer 32 to penetrate the insulating layer 32 to expose the other face of the wiring layer 31. The via holes 22x and 32x can be formed, for example, by a laser machining method using a $CO_2$ laser etc. It is preferable that desmear treatment is applied to the via holes 22x and 32x after the formation of the via holes 22x and 32x, so as to remove resin residues stuck to the surfaces of the wiring layer 21 and the wiring layer 31 exposed respectively in bottom portions of the via holes 22x and 32x.

Next, a wiring layer 23 is formed on one side of the insulating layer 22 in a step shown in FIG. 5B. The wiring layer 23 is configured to include via wirings with which the via holes 22x are filled, and wiring patterns which are formed on the one face of the insulating layer 22. The wiring layer 23 is electrically connected to the wiring layer 21 exposed in the bottom portions of the via holes 22x.

In a similar manner or the same manner, a wiring layer 33 is formed on the other side of the insulating layer 32. The wiring layer 33 is configured to include via wirings with which the via holes 32x are filled, and wiring patterns which are formed on the other face of the insulating layer 32. The wiring layer 33 is electrically connected to the wiring layer 31 exposed in the bottom portions of the via holes 32x.

For example, copper (Cu) etc. can be used as the material of each of the wiring layers 23 and 33. The wiring layer 23, 33 can be, for example, made about 10 μm to 30 μm thick.

The wiring layer 23, 33 can be formed by use of any of various wiring forming methods such as a semi-additive method and a subtractive method.

Figure 6A:
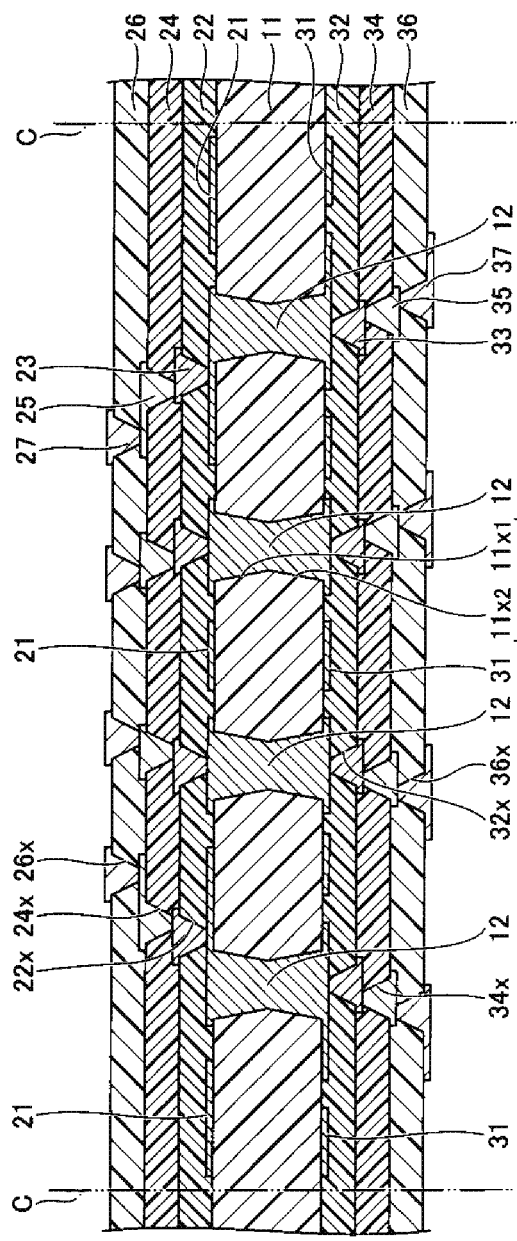
FIGS. 6A and 6B are sectional views showing the manufacturing method of the wiring substrate according to the first embodiment (Part 4)

Next, as shown in FIG. 6A, when the steps shown in FIGS. 4B to 5B are repeatedly performed, an insulating layer 24, a wiring layer 25, an insulating layer 26, and a wiring layer 27 are sequentially formed on the wiring layer 23. In addition, an insulating layer 34, a wiring layer 35, an insulating layer 36, and a wiring layer 37 are sequentially formed on the wiring layer 33. Incidentally, the number of the deposited wiring layers or the number of the deposited insulating layers can be set desirably.

That is, the insulating layer 24 is formed on the one face of the insulating layer 22 to cover the wiring layer 23. In a similar manner or the same manner, the insulating layer 34 is formed on the other face of the insulating layer 32 to cover the wiring layer 33. Via holes 24x are formed to penetrate the insulating layer 24 to expose one face of the wiring layer 23. In a similar manner or the same manner, via holes 34x are formed to penetrate the insulating layer 34 to expose the other face of the wiring layer 33. The material or thickness of each of the insulating layers 24 and 34 can be, for example, made similar to or the same as the insulating layer 22. The insulating layer 24, 34 may include a filler made of silica ($SiO_2$) etc.

Further, the wiring layer 25 is formed on one side of the insulating layer 24. The wiring layer 25 is configured to include via wirings with which the via holes 24x are filled, and wiring patterns which are formed on the one face of the insulating layer 24. The wiring layer 25 is electrically connected to the wiring layer 23 exposed inside the via holes 24x. In a similar manner or the same manner, the wiring layer 35 is formed on the other side of the insulating layer 34. The wiring layer 35 is configured to include via wirings with which the via holes 34x are filled, and wiring patterns which are formed on the other face of the insulating layer 34. The wiring layer 35 is electrically connected to the wiring layer 33 exposed inside the via holes 34x. The material or thickness of each of the wirings 25 and 35 can be, for example, made similar to or the same as the wiring layer 23.

Further, the insulating layer 26 is formed on the one face of the insulating layer 24 to cover the wiring layer 25. In a similar manner or the same manner, the insulating layer 36 is formed on the other face of the insulating layer 34 to cover the wiring layer 35. Via holes 26x are formed to penetrate the insulating layer 26 to expose one face of the wiring layer 25. In a similar manner or the same manner, via holes 36x are formed to penetrate the insulating layer 36 to expose the other face of the wiring layer 35. The material or thickness of each of the insulating layers 26 and 36 can be, for example, made similar to or the same as the insulating layer 22. The insulating layer 26, 36 may include a filler made of silica ($SiO_2$) etc.

Further, the wiring layer 27 is formed on one side of the insulating layer 26. The wiring layer 27 is configured to include via wirings with which the via holes 26x are filled, and wiring patterns which are formed on the one face of the insulating layer 26. The wiring layer 27 is electrically connected to the wiring layer 25 exposed inside the via holes 26x. In a similar manner or the same manner, the wiring layer 37 is formed on the other side of the insulating layer 36. The wiring layer 37 is configured to include via wirings with which the via holes 36x are filled, and wiring patterns which are formed on the other face of the insulating layer 36. The wiring layer 37 is electrically connected to the wiring layer 35 exposed inside the via holes 36x. The material or thickness of each of the wiring layers 27 and 37 can be, for example, made similar to or the same as the wiring layer 23.

Figure 6B:
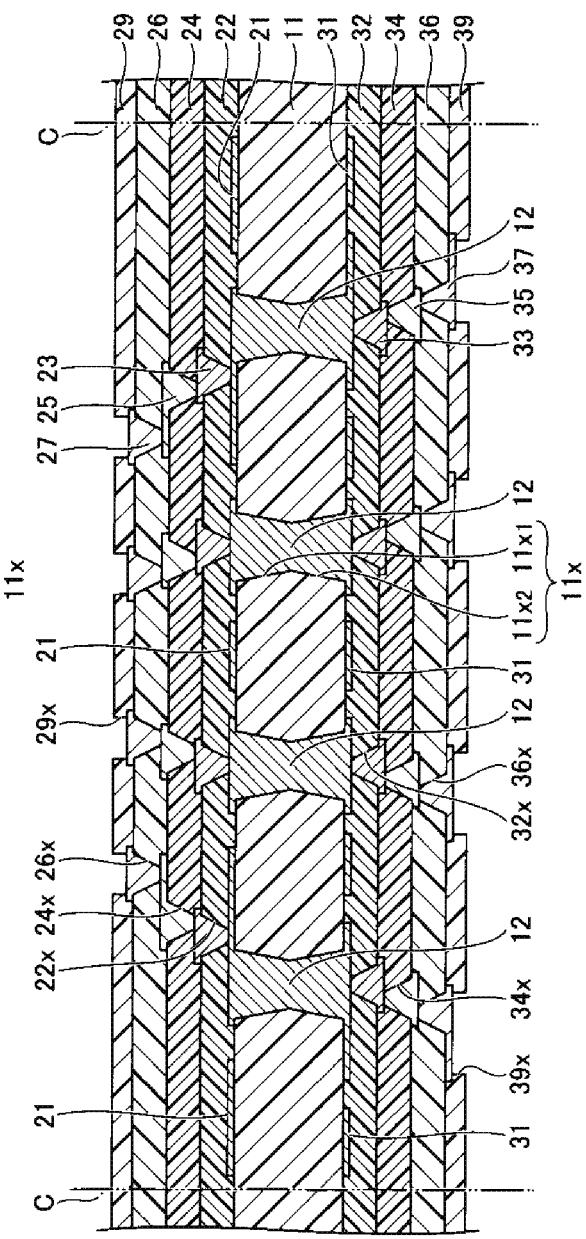

Next, as shown in FIG. 6B, a solder resist layer 29 is formed on the one face of the insulating layer 26 to cover the wiring layer 27 (however, the solder resist layer 29 may be formed to entirely expose the wiring layer 27, as described above). The solder resist layer 29 can be formed, for example, by applying a liquid or paste-like photosensitive epoxy-based insulating resin to the one face of the insulating layer 26 by a screen printing method, a roll coating method, a spin coating method, etc. so as to cover the wiring layer 27. Alternatively, the solder resist layer 29 may be formed, for example, by laminating a film-like photosensitive epoxy-based insulating resin on the one face of the insulating layer 26 to cover the wiring layer 27. In a similar manner or the same manner, a solder resist layer 39 is formed on the other face of the insulating layer 36 to cover the wiring layer 37.

The applied or laminated insulating resin is exposed to light and developed so that opening portions 29x are formed in the solder resist layer 29 (photolithography). In addition, opening portions 39x are formed in the solder resist layer 39 (photolithography). Incidentally, the opening portions 29x and 39x may be formed by a laser machining method or blast treatment. Each of the opening portions 29x and 39x can be formed, for example, into a circular shape in plan view. The diameter of the opening portion 29x, 39x can be desirably designed in accordance with a terminal pitch etc. of a semiconductor chip or a motherboard.

A metal layer etc. may be formed on each of one face of the wiring layer 27 (first pads 27) and the other face of the wiring layer 37 (second pads 37) exposed in bottom portions of the opening portions 29x and 39x respectively, for example, by an electroless plating method etc. if occasions demand. Examples of the metal layer may include an Au layer, an Ni/Au layer (a metal layer in which an Ni layer and an Au layer are deposited in the named order), an Ni/Pd/Au layer (a metal layer in which an Ni layer, a Pd layer and an Au layer are formed in this order), etc. In addition, in place of the formation of the metal layer, antioxidation treatment such as OSP (Organic Solderability Preservative) treatment may be performed on the one face of the wiring layer 27 and the other face of the wiring layer 37 exposed in the bottom portions of the opening portions 29x and 39x respectively.

Figure 7A:
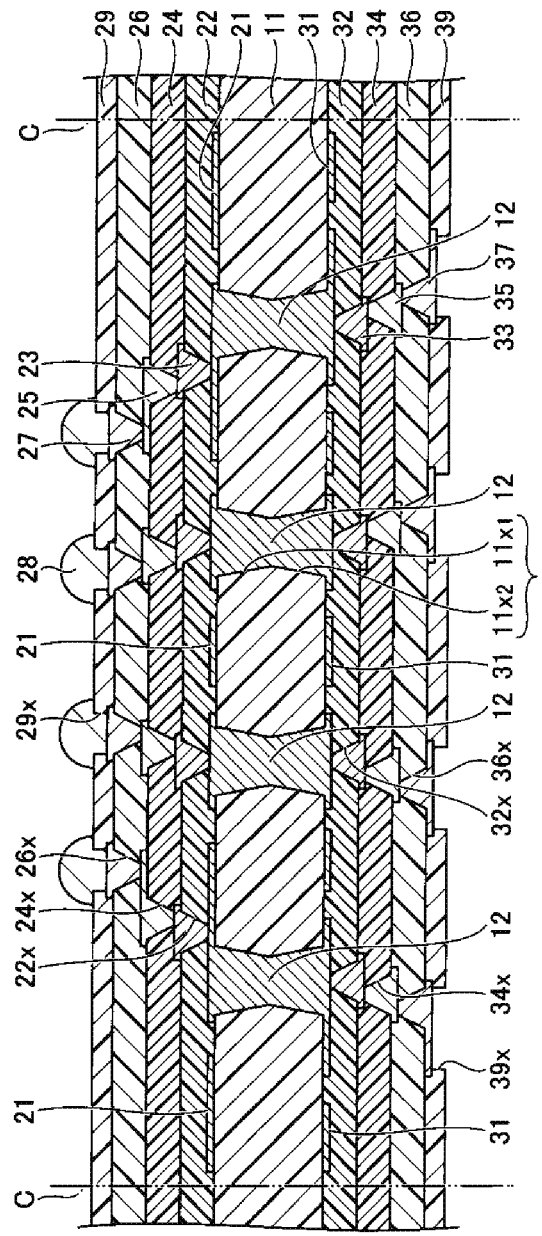
FIGS. 7A and 7B are sectional views showing the manufacturing method of the wiring substrate according to the first embodiment (Part 5)

Next, as shown in FIG. 7A, external connection terminals 28 are formed on the metal layer etc. on the first pads 27 in a case where the metal layer etc. is formed on the first pads 27. For example, solder balls etc. can be used as the external connection terminals 28. For example, an alloy containing Pd, an Sn—Cu alloy, an Sn—Sb alloy, an Sn—Ag alloy, an Sn—Ag—Cu alloy, etc. can be used as the material of the solder balls.

As an example of a forming method of the external connection terminals 28, for example, flux may be applied as a surface treatment agent on the metal layer etc. on the first pads 27 when the metal layer etc. has been formed on the first pads 27. Solder balls are mounted and reflowed at a temperature of about 240° C. to 260° C. Then, the surface is cleaned to remove the flux. In this manner, the external connection terminals 28 can be formed.

Figure 7B:
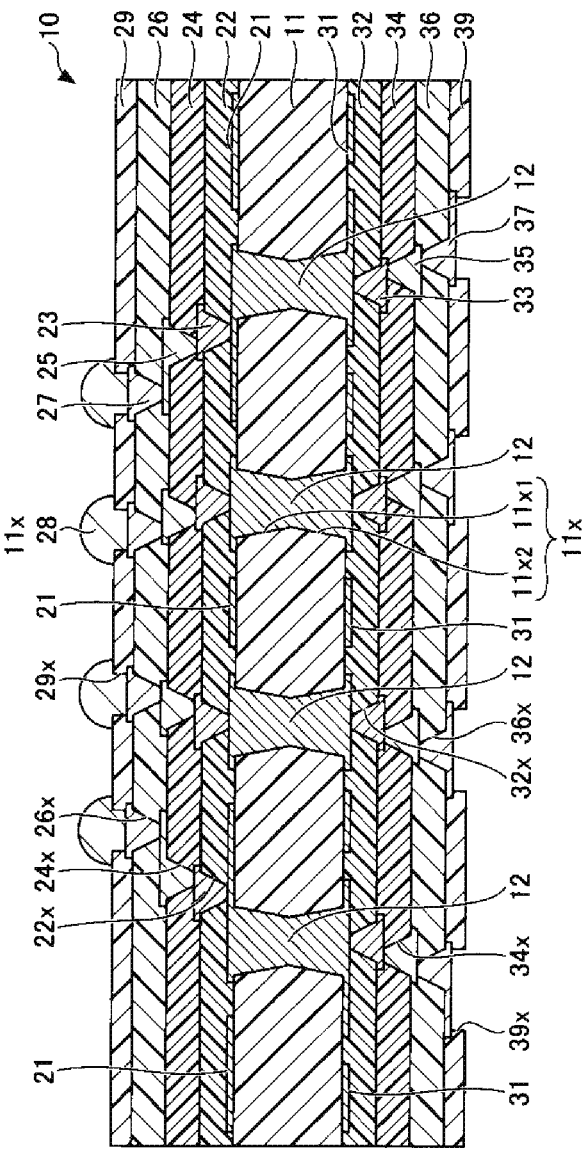

After the external connection terminals 28 are formed, a wiring substrate 10 is cut along cutting lines C to be separated individually, as shown in FIG. 7B. The wiring substrate 10 is cut along the cutting lines C by a slicer etc. to be separated individually.

In this manner, the wiring substrate 10 according to the first embodiment can be manufactured. Incidentally, the individual separation of the wiring substrate 10 may be performed without forming the external connection terminals 28 after the step shown in FIG. 6B. That is, the external connection terminals 28 may be excluded from the wiring substrate 10.

A method for forming the wiring layers 21 and 31 and the through wirings 12 will be described here. The wiring layer 21 and 31 and the through wirings 12 can be manufactured roughly by two kinds of methods.

<First Method>

In the first method, the wiring layers 21 and 31 are formed by a semi-additive method. FIGS. 8A to 10B are sectional views showing the first method for forming the wiring layers 21 and 31 and one of the through wirings 12. A portion corresponding to that in FIG. 2 is shown in FIGS. 8A to 10B.

Figure 8A:
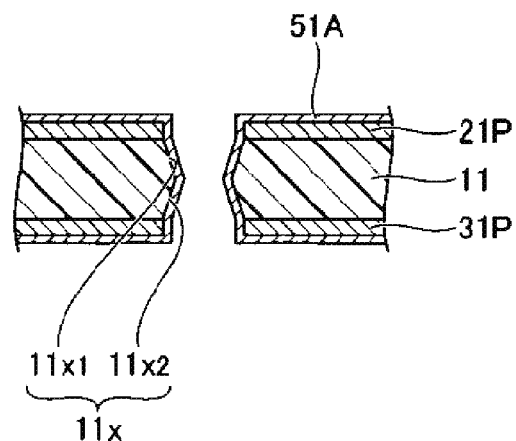
FIGS. 8A to 8C are sectional views showing a first method for forming wiring layers and a through wiring (Part 1)

In the first method, a first metal layer 51A is formed after the step shown in FIG. 3A and the step shown in FIG. 3B to cover the first metal foil 21P, the inner wall face of the through hole 11x, and the second metal foil 31P, as shown in FIG. 8A. The first metal layer 51A can be formed, for example, by an electroless plating method etc. For example, copper (Cu) etc. can be used as the material of the first metal layer 51A. The first metal layer 51A can be, for example, made about 0.5 μm to 1.0 μm thick. The first metal layer 51A is a power feeding layer for performing electrolytic plating in a subsequent step, which layer will be finally etched into a layer serving as a first metal layer 51.

Figure 8B:
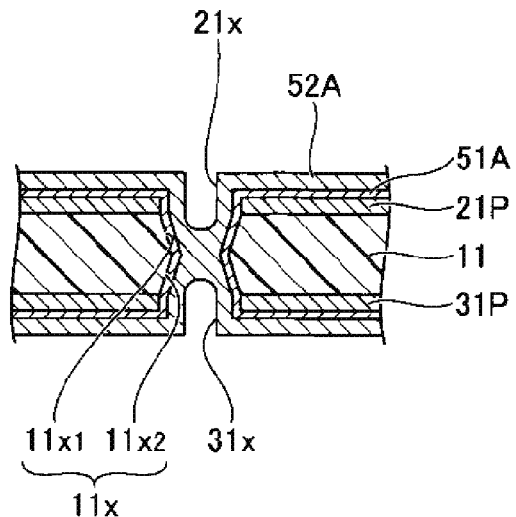

Next, as shown in FIG. 8B, a second metal layer 52A is formed on the first metal layer 51A by an electrolytic plating method using the first metal layer 51A as a power feeding layer. The second metal layer 52A is formed solidly on the first metal layer 51A above the one face of the core layer 11. In addition, the second metal layer 52A is formed solidly on the first metal layer 51A above the other face of the core layer 11. In addition, the second metal layer 52A covers the first metal layer 51A covering the inner wall face of the through hole 11x without entirely filling the through hole 11x, and is formed to fill a central portion of the through hole 11x. For example, copper (Cu) etc. can be used as the material of the second metal layer 52A. The second metal layer 52A above the one face and the other face of the core layer 11 can be, for example, made about 5 μm to 7 μm thick. The second metal layer 52A will be finally etched into a layer serving as a second metal layer 52.

Incidentally, the vicinity of the center portion of the through hole 11x is filled by the second metal layer 52A. However, a first recess portion 21x which uses the second metal layer 52A as its bottom portion and is opened on the one face side of the core layer 11 is formed inside the through hole 11x and above the through hole 11x. The second metal layer 52A entirely fills the central portion of the through hole 11x. In addition, a second recess portion 31x which uses the second metal layer 52A as its bottom portion and is opened on the other face side of the core layer 11 is formed inside the through hole 11x and below the through hole 11x. The second metal layer 52A entirely fills the central portion of the through hole 11x. In other words, the sectional shape of the second metal layer 52A formed inside the through hole 11x is an X-shape. For example, the second metal layer 52A has a thickness about 60% to 70% of the thickness of the core layer 11 at the center of the through hole 11x.

As to the electrolytic plating used for the formation of the second metal layer 52A, for example, a pulsed power supply is used, and a current density is set at about 3.0 A/dmin$^2$ to 4.0 A/dmin$^2$. In addition, for example, a plating solution containing copper sulfate at a concentration of about 260 g/L to 280 g/L, sulfuric acid at a concentration of about 50 g/L to 90 g/L, and chloride ion at a concentration of about 80 g/L to 100 g/L is used as a plating solution for forming the second metal layer 52A. Since the pulsed power supply is used, the second metal layer 52A entirely filling the central portion of the through hole 11x is easily formed.

Figure 8C:
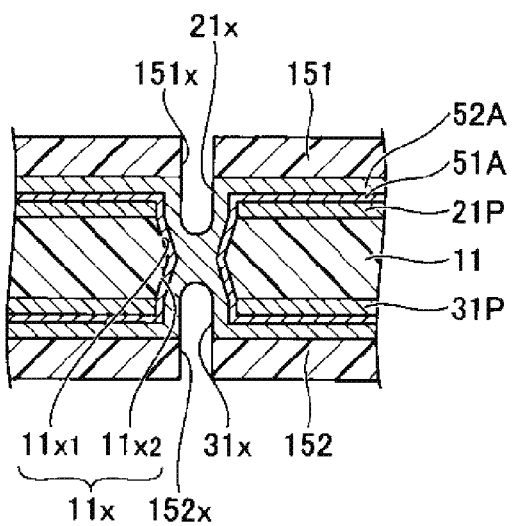

Next, as shown in FIG. 8C, a first resist layer 151 having a first opening portion 151x corresponding to the first recess portion 21x is formed on the second metal layer 52A on the one face side of the core layer 11. In addition, a second resist layer 152 having a second opening portion 152x corresponding to the second recess portion 31x is formed on the second metal layer 52A on the other face side of the core layer. For example, a dry film etc. can be used as each of the first resist layer 151 and the second resist layer 152, and can be patterned to form the first opening portion 151x or the second opening portion 152x.

Figure 9A:
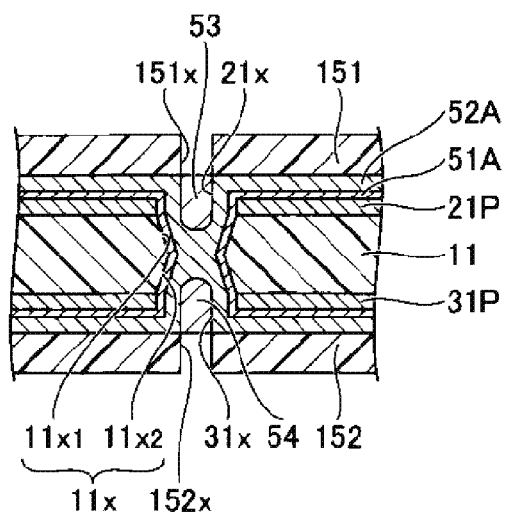
FIGS. 9A to 9C are sectional views showing the first method for forming the wiring layers and the through wiring (Part 2)

Next, as shown in FIG. 9A, a third metal layer 53 is formed on the second metal layer 52A exposed inside the first opening portion 151x by an electrolytic plating method using the first metal layer 51A as a power feeding layer so that the first recess portion 21x is filled with the third metal layer 53. In addition, a fourth metal layer 54 is formed on the second metal layer 52A exposed inside the second opening portion 152x by an electrolytic plating method using the first metal layer 51A as a power feeding layer so that the second recess portion 31x is filled with the fourth metal layer 54. For example, copper (Cu) etc. can be used as the material of each of the third metal layer 53 and the fourth metal layer 54. The third metal layer 53 or the fourth metal layer 54 can be, for example, made about 30 μm to 50 μm thick at the center of the through hole 11x.

As to the electrolytic plating used for the formation of the third metal layer 53 and the fourth metal layer 54, for example, a DC power supply is used, and a current density is set at about 1.5 A/dm$^2$ to 2.0 A/dm$^2$. In addition, for example, a plating solution (first plating solution) containing copper sulfate at a concentration (first concentration) of about 220 g/L to 270 g/L, sulfuric acid at a concentration (second concentration) of about 40 g/L to 80 g/L, and chloride ion at a concentration of about 20 g/L to 40 g/L is used as a plating solution for forming the third metal layer 53 and the fourth metal layer 54. By the use of such a plating solution, the first recess portion 21x is easily filled with the third metal layer 53, and the second recess portion 31x is easily filled with the fourth metal layer 54. In addition, an average crystal grain size of the third metal layer 53 and an average crystal grain size of the fourth metal layer 54 are smaller than an average crystal grain size of the second metal layer 52A.

Incidentally, each of an upper face of the third metal layer 53 and a lower face of the fourth metal layer 54 is substantially flat. Preferably, the upper face of the third metal layer 53 is flush with an upper face of the second metal layer 52A, and the lower face of the fourth metal layer 54 is flush with a lower face of the second metal layer 52A.

Figure 9B:
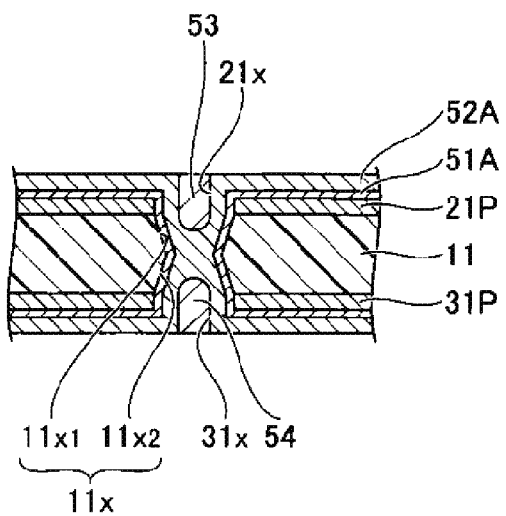

Next, as shown in FIG. 9B, the first resist layer 151 and the second resist layer 152 are peeled.

Figure 9C:
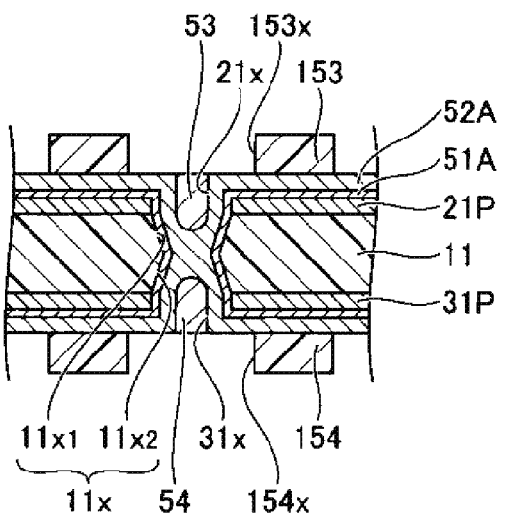

Next, as shown in FIG. 9C, a third resist layer 153 having a third opening portion 153x corresponding to the wiring layer 21 is formed on the second metal layer 52A on the one face side of the core layer 11. In addition, a fourth resist layer 154 having a fourth opening portion 154x corresponding to the wiring layer 31 is formed on the second metal layer 52A on the other face side of the core layer 11. For example, a dry film etc. can be used as each of the third resist layer 153 and the fourth resist layer 154, and can be patterned to form the third opening portion 153x or the fourth opening portion 154x.

Figure 10A:
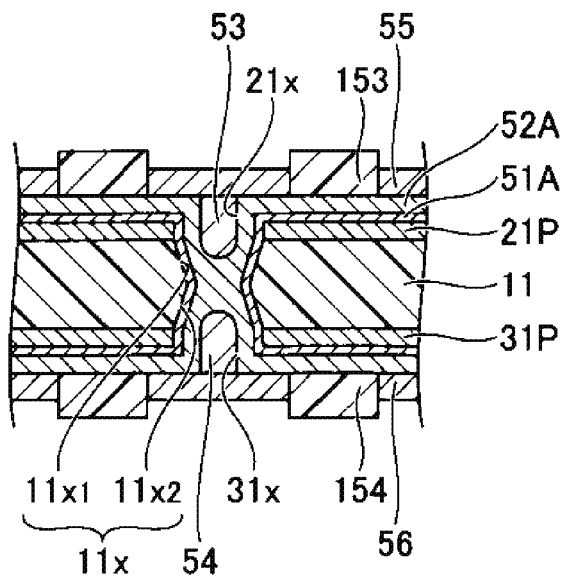
FIGS. 10A and 10B are sectional views showing the first method for forming the wiring layers and the through wiring (Part 3)

Next, as shown in FIG. 10A, a fifth metal layer 55 is formed on the second metal layer 52A exposed inside the third opening portion 153x and on the third metal layer 53 by an electrolytic plating method using the first metal layer 51A as a power feeding layer. In addition, a sixth metal layer 56 is formed on the second metal layer 52A exposed inside the fourth opening portion 154x and on the fourth metal layer 54 by an electrolytic plating method using the first metal layer 51A as a power feeding layer. For example, copper (Cu) etc. can be used as the material of each of the fifth metal layer 55 and the sixth metal layer 56. The fifth metal layer 55 or the sixth metal layer 56 can be, for example, made about 10 μm to 15 μm thick. For example, the fifth metal layer 55 is formed to be thicker than the second metal layer 52 above the one face of the core layer 11, and the sixth metal layer 56 is formed to be thicker than the second metal layer 52 above the other face of the core layer 11. The fifth metal layer 55 may be formed to be thinner than the second metal layer 52 above the one face of the core layer 11, and the sixth metal layer 56 may be formed to be thinner than the second metal layer 52 above the other face of the core layer 11.

As to the electrolytic plating used for the formation of the fifth metal layer 55 and the sixth metal layer 56, for example, a DC power supply is used, and a current density is set at about 1.0 A/dm² to 1.5 A/dmin². In addition, a plating solution containing copper sulfate at a lower concentration and sulfuric acid at a higher concentration than the plating solution for forming the third metal layer 53 and the fourth metal layer 54 is used as a plating solution for forming the fifth metal layer 55 and the sixth metal layer 56. For example, a plating solution (second plating solution) containing copper sulfate at a concentration (third concentration) of about 140 g/L to 180 g/L, sulfuric acid at a concentration (fourth concentration) of about 120 g/L to 160 g/L, and chloride ion at a concentration of about 10 g/L to 20 g/L may be used. By use of such a plating solution, the fifth metal layer 55 whose upper face is excellent in flatness is easily formed, and the sixth metal layer 56 whose lower face is excellent in flatness is easily formed. In addition, for example, an average crystal grain size of the fifth metal layer 55 and an average crystal grain size of the sixth metal layer 56 can be similar to or the same as the average crystal grain size of the third metal layer 53 and the average crystal grain size of the fourth metal layer 54.

Figure 10B:
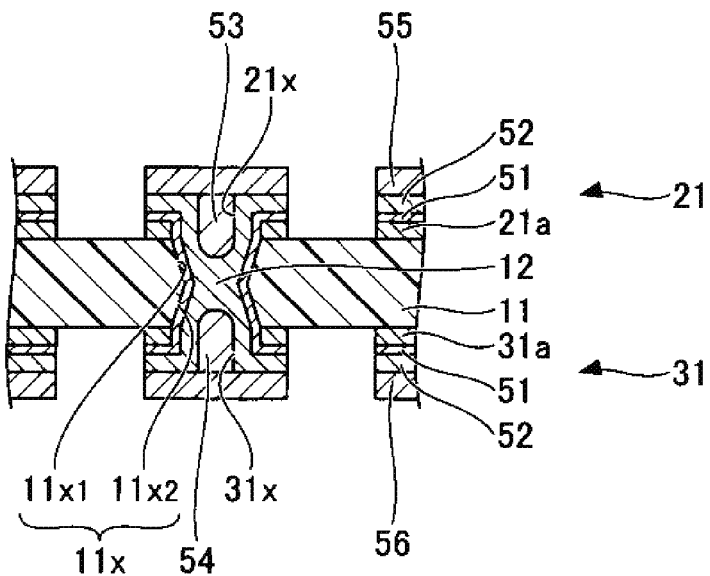

Next, as shown in FIG. 10B, the third resist layer 153 and the fourth resist layer 154 are removed. Next, a portion made up of the first metal foil 21P, the first metal layer 51A and the second metal layer 52A and exposed from the fifth metal layer 55 is removed by etching with the fifth metal layer 55 as a mask. In addition, a portion made up of the second metal foil 31P, the first metal layer 51A and the second metal layer 52A and exposed from the sixth metal layer 56 is removed by etching with the sixth metal layer 56 as a mask.

Thus, the wiring layer 21 which includes the first metal foil 21a, the first metal layer 51, the second metal layer 52 and the fifth metal layer 55 and which is patterned into a predetermined planar shape is formed on the one face side of the core layer 11. In addition, the wiring layer 31 which includes the second metal foil 31a, the first metal layer 51, the second metal layer 52 and the sixth metal layer 56 and which is patterned into a predetermined planar shape is formed on the other face side of the core layer 11. Further, the through wiring 12 including the first metal layer 51, the second metal layer 52, the third metal layer 53 and the fourth metal layer 54 is formed inside the through hole 11x.

<Second Method>

Figure 11A:
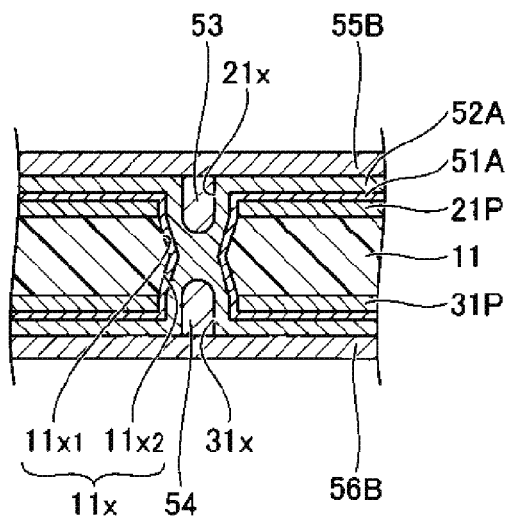
FIGS. 11A to 11C are sectional views showing a second method for forming wiring layers and a through wiring.
Figure 11B:
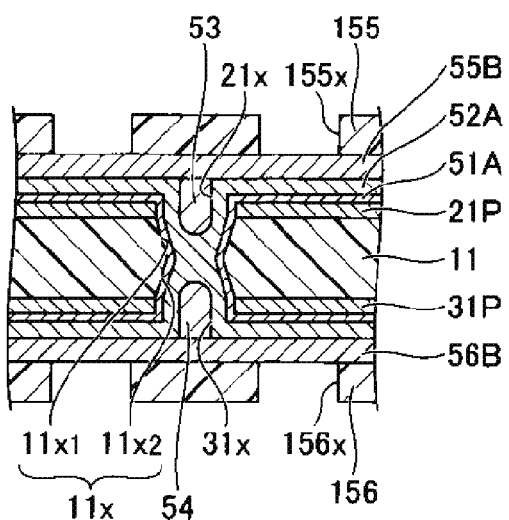
Figure 11C:
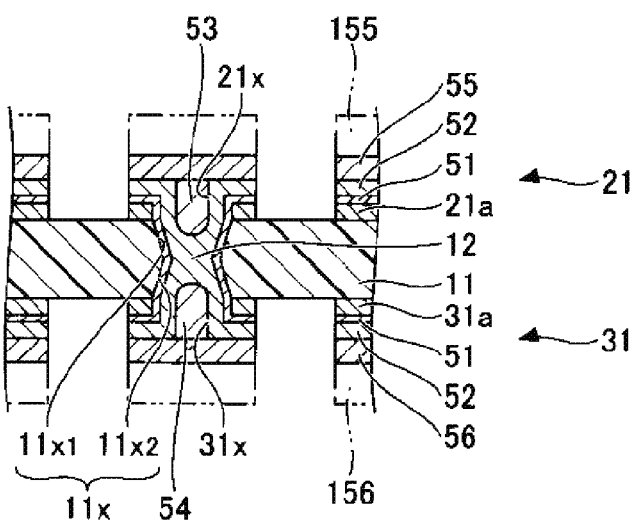

In a second method, the wiring layers 21 and 31 are formed by a subtractive method. FIGS. 11A to 11C are sectional views showing the second method for forming the wiring layers 21 and 31 and one of the through wirings 12. A portion corresponding to that in FIG. 2 is shown in FIGS. 11A to 11C.

In the second method, first, processing up to peeling of the first resist layer 151 and the second resist layer 152 is performed in a similar manner to or the same manner as that in the first method (see FIG. 9B). Next, as shown in FIG. 11A, a fifth metal layer 55B is formed on the second metal layer 52A on the one face side of the core layer 11 and on the third metal layer 53 by an electrolytic plating method using the first metal layer 51A as a power feeding layer. In addition, a sixth metal layer 56B is formed on the second metal layer 52A on the other face side of the core layer 11 and on the fourth metal layer 54 by an electrolytic plating method using the first metal layer 51A as a power feeding layer. For example, copper (Cu) etc. can be used as the material of each of the fifth metal layer 55B and the sixth metal layer 56B. The fifth metal layer 55B or the sixth metal layer 56B can be, for example, made about 10 μm to 15 μm thick. The fifth metal layer 55B and the sixth metal layer 56B will be finally etched into layers serving as a fifth metal layer 55 and a sixth metal layer 56 respectively.

As to the electrolytic plating used for the formation of the fifth metal layer 55B and the sixth metal layer 56B, for example, a DC power supply is used, and a current density is set at about 1.0 A/dm² to 1.5 A/dmin². In addition, a plating solution containing copper sulfate at a lower concentration and sulfuric acid at a higher concentration than the plating solution for forming the third metal layer 53 and the fourth metal layer 54 is used as a plating solution for forming the fifth metal layer 55B and the sixth metal layer 56B. For example, a plating solution containing copper sulfate at a concentration of about 140 g/L to 180 g/L, sulfuric acid at a concentration of about 120 g/L to 160 g/L, and chloride ion at a concentration of about 10 g/L to 20 g/L may be used. By use of such a condition, the fifth metal layer 55B whose upper face is excellent in flatness is easily formed, and the sixth metal layer 56B whose lower face is excellent in flatness is easily formed. In addition, an average crystal grain size of the fifth metal layer 55B and an average crystal grain size of the sixth metal layer 56B can be similar to or the same as the average crystal grain size of the third metal layer 53 and the average crystal grain size of the fourth metal layer 54.

Next, as shown in FIG. 11B, a fifth resist layer 155 having a fifth opening portion 155x corresponding to a portion except a scheduled region for forming the wiring layer 21 is formed on the fifth metal layer 55B. In addition, a sixth resist layer 156 having a sixth opening portion 156x corresponding to a portion except a scheduled region for forming the wiring layer 31 is formed on the sixth metal layer 56B. For example, a dry film etc. can be used as each of the fifth resist layer 155 and the sixth resist layer 156, and can be patterned to form the fifth opening portion 155x or the sixth opening portion 156x.

Next, as shown in FIG. 11C, a portion made up of the first metal foil 21P, the first metal layer 51A, the second metal layer 52A and the fifth metal layer 55B and exposed from the fifth resist layer 155 is removed by etching with the fifth resist layer 155 as a mask. In addition, a portion made up of the second metal foil 31P, the first metal layer 51A, the second metal layer 52A and the sixth metal layer 56B and exposed from the sixth resist layer 156 is removed by etching with the sixth resist layer 156 as a mask. The fifth resist layer 155 and the sixth resist layer 156 are removed.

Thus, the wiring layer 21 which includes the first metal foil 21a, the first metal layer 51, the second metal layer 52, the third metal layer 53 and the fifth metal layer 55 and which is patterned into a predetermined planar shape is formed on the one face side of the core layer 11. In addition, the wiring layer 31 which includes the second metal foil 31a, the first metal layer 51, the second metal layer 52, the fourth metal layer 54 and the sixth metal layer 56 and which is patterned into a predetermined planar shape is formed on the other face side of the core layer 11. Further, the through wiring 12 including the first metal layer 51, the second metal layer 52, the third metal layer 53 and the fourth metal layer 54 is formed inside the through hole 11x.

According to such a manufacturing method, the first recess portion 21x can be filled with the third metal layer 53 suitably, and the second recess portion 31x can be filled with the fourth metal layer 54 suitably. In addition, the scheduled region for forming the wiring layer 21 on the one side of the core layer 11 is covered with the first resist layer 151 during the formation of the third metal layer 53. The fifth metal layer 55 or 55B is formed after the formation of the third metal layer 53. Accordingly, the thickness of the wiring layer 21 can be adjusted independently of the third metal layer 53 and suitably. In a similar manner or the same manner, the scheduled region for forming the wiring layer 31 on the other side of the core layer 11 is covered with the second resist layer 152 during the formation of the fourth metal layer 54. The sixth metal layer 56 or 56B is formed after the formation of the fourth metal layer 54. Accordingly, the thickness of the wiring layer 31 can be adjusted independently of the fourth metal layer 54 and suitably.

Method of Reference Example

Figure 12A:
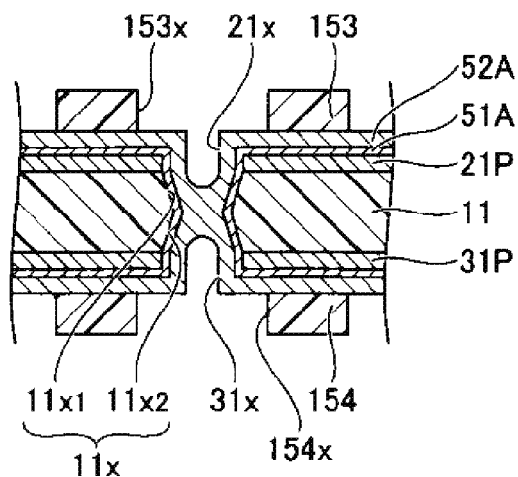
FIGS. 12A to 12C are sectional views showing a method of a reference example for forming wiring layers and a through wiring.
Figure 12B:
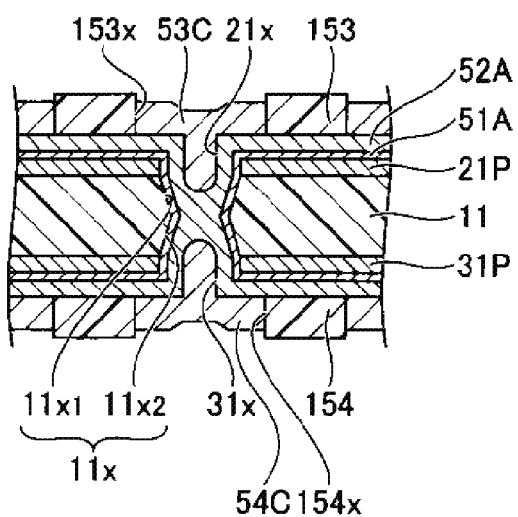
Figure 12C:
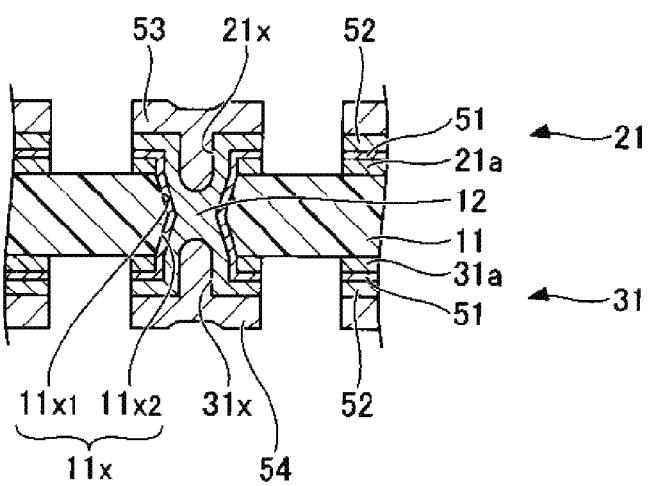

In order to make comparison, a method of a reference example will be described. In the method of the reference example, wiring layers 21 and 31 are formed by a semi-additive method. FIGS. 12A to 12C are sectional views showing the method of the reference example for forming the wiring layers 21 and 31 and one of the through wirings 12.

In the method of the reference example, first, processing up to formation of a second metal layer 52A is performed in a similar manner to or the same manner as that in the first method (see FIG. 8B). Next, as shown in FIG. 12A, a third resist layer 153 having a third opening portion 153x corresponding to the wiring layer 21 is formed on the second metal layer 52A on the one face side of the core layer 11. In addition, a fourth resist layer 154 having a fourth opening portion 154x corresponding to the wiring layer 31 is formed on the second metal layer 52A on the other face side of the core layer 11.

Next, as shown in FIG. 12B, a third metal layer 53C is formed on the second metal layer 52A exposed inside the third opening portion 153x by an electrolytic plating method using the first metal layer 51A as a power feeding layer. In addition, a fourth metal layer 54C is formed on the second metal layer 52A exposed inside the fourth opening portion 154x by an electrolytic plating method using the first metal layer 51A as a power feeding layer. For example, copper (Cu) etc. can be used as the material of each of the third metal layer 53C and the fourth metal layer 54C. The third metal layer 53C or the fourth metal layer 54C is set to be thick enough to fill the first recess portion 21x or the second recess portion 31x.

Next, as shown in FIG. 12C, the third resist layer 153 and the fourth resist layer 154 are removed. Next, a portion made up of the first metal foil 21P, the first metal layer 51A and the second metal layer 52A and exposed from the third metal layer 53C is removed by etching with the third metal layer 53C as a mask. In addition, a portion made up of the second metal foil 31P, the first metal layer 51A and the second metal layer 52A and exposed from the fourth metal layer 54C is removed by etching with the fourth metal layer 54C as a mask.

Thus, the wiring layer 21 which includes the first metal foil 21a, the first metal layer 51, the second metal layer 52 and the third metal layer 53 and which is patterned into a predetermined planar shape is formed on the one face side of the core layer 11. In addition, the wiring layer 31 which includes the second metal foil 31a, the first metal layer 51, the second metal layer 52 and the fourth metal layer 54 and which is patterned into a predetermined planar shape is formed on the other face side of the core layer 11.

In the method of the reference example, however, the third metal layer 53C above the one face of the core layer 11 is excessively thick, or the fourth metal layer 54C above the other face of the core layer 11 is excessively thick, as shown in FIG. 12B. This is because a precipitation amount onto a flat portion is larger than a precipitation amount onto a recess portion when a plating metal is simultaneously precipitated on the flat portion and the recess portion by electrolytic plating. That is, when the third metal layer 53C is formed to be thick enough to fill the first recess portion 21x, and the fourth metal layer 54C is formed to be thick enough to fill the second recess portion 31x by electrolytic plating according to the method of the reference example, the third metal layer 53C and the fourth metal layer 54C above one face and the other face of the core layer 11 become excessively thick. When the third metal layer 53C is excessively thick, there is a fear that etching the first metal foil 21P, the first metal layer 51A and the second metal layer 52A may be hindered. When the fourth metal layer 54C is excessively thick, there is a fear that etching the second metal foil 31P, the first metal layer 51A and the second metal layer 52A may be hindered.

On the other hand, when the thickness of the third metal layer 53C above the one face of the core layer 11 and the thickness of the fourth metal layer 54C above the other face of the core layer 11 are made similar to or the same as the thicknesses (e.g. about 10 μm to 15 μm) of the fifth metal layer 55 and the sixth metal layer 56 according to the first method, the first recess portion 21x and the second recess portion 31x cannot be filled with the third metal layer 53C and the fourth metal layer 54C suitably.

Thus, according to the method of the reference example, the suitable filling of the first recess portion 21x with the third metal layer 53C cannot be made compatible with the formation of the wiring layer 21 with the suitable thickness. In a similar manner or the same manner, the suitable filling of the second recess portion 31x with the fourth metal layer 54C cannot be made compatible with the formation of the wiring layer 31 with the suitable thickness.

Also in a case where the first recess portion 21x is intended to be filled with a metal layer formed on the second metal layer 52A on the one side of the core layer 11 in order to form the wiring layer 21 by the subtractive method, it is still difficult to make the suitable filling of the first recess portion 21x compatible with the formation of the wiring layer 21 with the suitable thickness. In a similar manner or the same manner, also in a case where the second recess portion 31x is intended to be filled with a metal layer formed on the second metal layer 52A on the other side of the core layer 11 in order to form the wiring layer 31 by the subtractive method, it is still difficult to make the suitable filling of the second recess portion 31x compatible with the formation of the wiring layer 31 with the suitable thickness.

According to the present embodiment, the first metal foil 21a is formed on the one face of the core layer 11, and the second metal foil 31a is formed on the other face of the core layer 11. However, the present embodiment is not limited to thereto. For example, the first metal layer 51 may be directly formed on both faces of the core layer 11 without providing the first metal foil 21a and the second metal foil 31a on the both faces of the core layer 11. In this case, after the through hole 11x is formed through the core layer 11 not formed with any metal foil, the first metal layer 51A may be formed on the both faces of the core layer 11 and the inner wall face of the through hole 11x through electroless plating method. The successive processes are the same as the manufacturing processes described in the first embodiment, and thus the explanation of the successive processes will be omitted herein.

Second Embodiment

Figure 13:
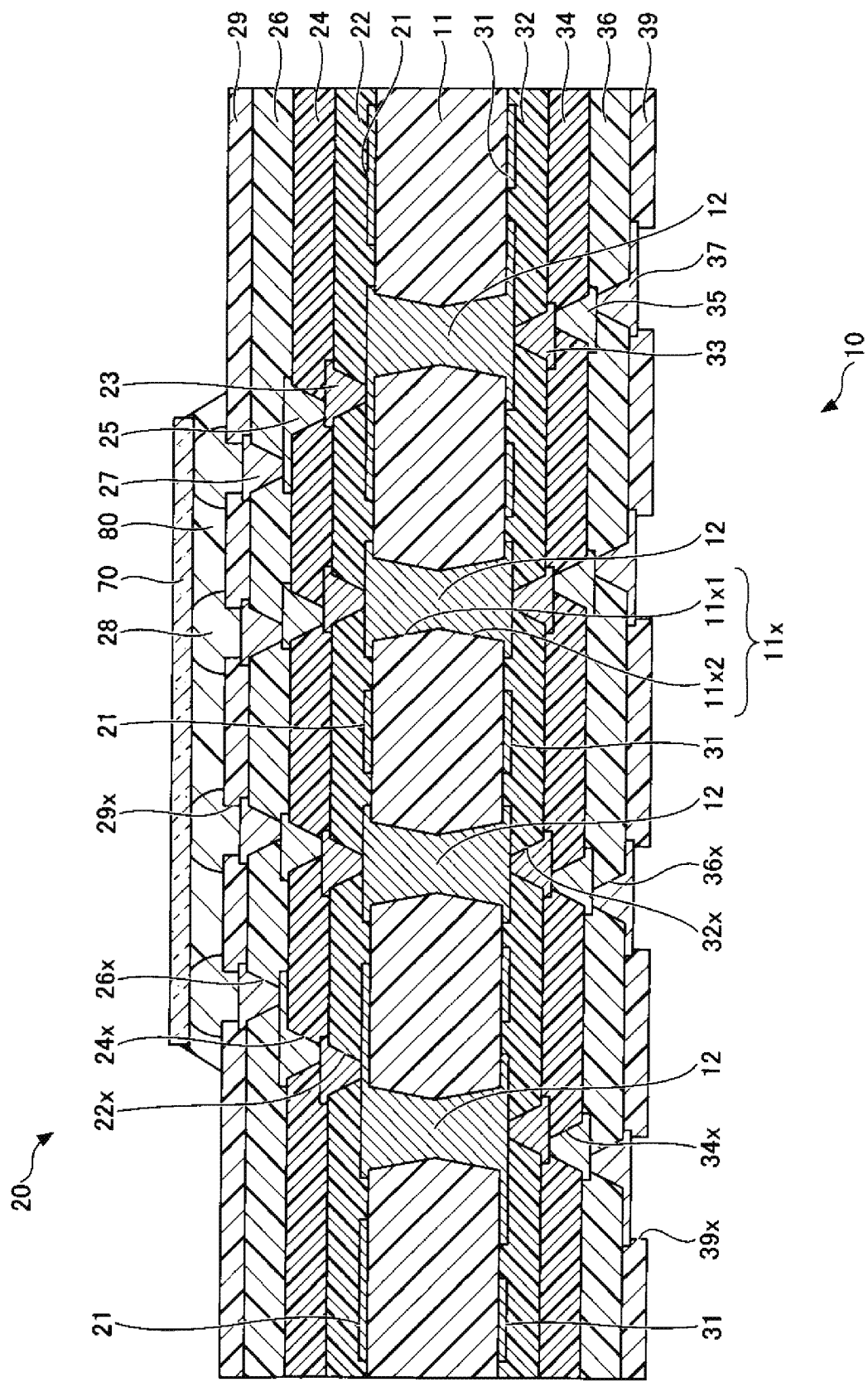
FIG. 13 is a sectional view showing a semiconductor package according to a second embodiment.

Next, a second embodiment will be described. The second embodiment relates to a semiconductor package including the wiring substrate 10 and a semiconductor chip. FIG. 13 is a sectional view showing the semiconductor package according to the second embodiment.

As shown in FIG. 13, the semiconductor package 20 according to the second embodiment has the wiring substrate 10, and a semiconductor chip 70 mounted on the wiring substrate 10. The semiconductor chip 70 has electrode pads (not shown). The electrode pads of the semiconductor chip 70 are connected to external connection terminals 28. In addition, a gap between the wiring substrate 10 and the semiconductor chip 70 is filled with an underfill resin 80.

In manufacturing such a semiconductor package 20, for example, the semiconductor chip 70 is disposed on the wiring substrate 10 so that the external connection terminals 28 of the wiring substrate 10 can be aligned with the electrode pads of the semiconductor chip 70 correspondingly and respectively. For example, solders constituting the external connection terminals 28 (solder balls) are heated to about 230° C. to be fused so that first pads 27 of the wiring substrate 10 and the electrode pads of the semiconductor chip 70 are electrically and mechanically connected to each other respectively. The gap between the wiring substrate 10 and the semiconductor chip 70 is filled with the underfill resin 80.

Incidentally, when solders are formed on the electrode pads of the semiconductor chip 70, the solders on the electrode pads of the semiconductor chip 70 and the solders constituting the external connection terminals 28 are fused to become an alloy. As a result, one bump is formed.

Although preferred embodiments etc. have been described above in detail, the present disclosure is not limited to the aforementioned embodiments etc. but various modifications and substitutions can be added to the aforementioned embodiments etc. without departing from the scope stated in CLAIMS.

Various aspects of the subject matter described herein are set out non-exhaustively in the following numbered clauses:

1) A method of manufacturing a wiring substrate, the method comprising:
preparing a core layer comprising a first face, and a second face opposite to the first face;
forming a through hole that penetrates the core layer so as to extend from the first face to the second face;
forming a first metal layer on or above the first and second faces and on an inner wall face of the through hole;
forming a second metal layer on the first metal layer so as to fill the through hole, wherein the second metal layer comprises a first recess portion opposed to the through hole, and a second recess portion opposed to the first recess portion through the through hole;
forming a third metal layer in the first recess portion;
forming a fourth metal layer in the second recess portion;
forming a fifth metal layer on the second metal layer and the third metal layer; and
forming a sixth metal layer on the second metal layer and the fourth metal layer.

2) The method according to clause (1), wherein
the forming the third metal layer comprises:
forming a first resist layer on the second metal layer opposed to the first face, the first resist layer comprising a first opening portion exposing the first recess portion, and
forming the third metal layer in the first recess portion by an electrolytic plating method using the first metal layer as a power feeding layer; and
the forming the fourth metal layer comprises:
forming a second resist layer on the second metal layer opposed to the second face, the second resist layer comprising a second opening portion exposing the second recess portion; and
forming the fourth metal layer in the second opening portion by an electrolytic plating method using the first metal layer as a power feeding layer.

3) The method according to clause (2), wherein
a first plating solution is used in forming the third metal layer and forming the fourth metal layer, wherein the first plating solution contains copper sulfate at a first concentration, and sulfuric acid at a second concentration, and
the fifth metal layer and the sixth metal layer are formed by an electrolytic plating method using a second plating solution, wherein the second plating solution contains copper sulfate at a third concentration lower than the first concentration, and sulfuric acid at a fourth concentration higher than the second concentration.

4) The method according to clause (2), wherein
the second metal layer is formed by an electrolytic plating method using a pulsed power supply, and
the third metal layer, the fourth metal layer, the fifth metal layer and the sixth metal layer are formed by an electrolytic plating method using a DC power supply.

5) The method according to clause (1), wherein
the forming the fifth metal layer comprises:
forming a third resist layer having a third opening portion on the second metal layer opposed to the first face and on the third metal layer; and
forming the fifth metal layer on the second metal layer exposed from the third opening portion and on the third metal layer by an electrolytic plating method using the first metal layer as a power feeding layer;
the forming the sixth metal layer comprises:
forming a fourth resist layer having a fourth opening portion on the second metal layer opposed to the second face and on the fourth metal layer; and
forming the sixth metal layer on the second metal layer exposed from the fourth opening portion and on the fourth metal layer by an electrolytic plating method using the first metal layer as a power feeding layer, and the method further comprises:

removing portions of the first metal layer and the second metal layer which are exposed from the fifth metal layer using the fifth metal layer as a mask; and removing portions of the first metal layer and the second metal layer which are exposed from the sixth metal layer, using the sixth metal layer as a mask.

6) The method according to clause (1), further comprising:

forming a fifth resist layer having a fifth opening portion on the fifth metal layer;

forming a sixth resist layer having a sixth opening portion on the sixth metal layer;

removing portions of the first metal layer, the second metal layer and the fifth metal layer which are exposed from the fifth resist layer, using the fifth resist layer as a mask; and removing portions of the first metal layer, the second metal layer and the sixth metal layer which are exposed from the sixth resist layer, using the sixth resist layer as a mask.

What is claimed is:

1. A wiring substrate comprising:
   a core layer comprising a first face, and a second face opposite to the first face;
   a through hole that penetrates the core layer so as to extend from the first face to the second face;
   a first metal layer that is formed on an inner wall face of the through hole and formed on the first and second faces;
   a second metal layer that is formed on the first metal layer and fills the through hole, wherein the second metal layer comprises a first recess portion opposed to the through hole, and a second recess portion opposed to the first recess portion via the through hole;
   a third metal layer that is provided in the first recess portion;
   a fourth metal layer that is provided in the second recess portion;
   a fifth metal layer that is formed on the second metal layer and the third metal layer; and
   a sixth metal layer that is formed on the second metal layer and the fourth metal layer,
   wherein
   the second metal layer, the third metal layer, the fourth metal layer, the fifth metal layer, and the sixth metal layer are made of copper,
   an average crystal grain size of the third metal layer and an average crystal grain size of the fourth metal layer are smaller than an average crystal grain size of the second metal layer, and
   the average crystal grain size of the third metal layer and the average crystal grain size of the fourth metal layer are substantially same as an average crystal grain size of the fifth metal layer and an average crystal grain size of the sixth metal layer.

2. The wiring substrate according to claim 1, further comprising:
   a first metal foil that is formed on the first face; and
   a second metal foil that is formed on the second face,
   wherein the first metal layer is formed on the first metal foil and the second metal foil.

3. The wiring substrate according to claim 1, wherein the second metal layer is formed to completely fill a central portion of the through hole in a depth direction of the through hole.

4. The wiring substrate according to claim 1, wherein the first recess portion and the second recess portion are partially overlapped with the through hole in a thickness direction of the core layer.

5. The wiring substrate according to claim 1, wherein an upper surface of the third metal layer is flush with an upper surface of the second metal layer.

6. The wiring substrate according to claim 1, wherein a lower surface of the fourth metal layer is flush with a lower surface of the second metal layer.

* * * * *